US012720964B2

(12) United States Patent
Bae et al.

(10) Patent No.: US 12,720,964 B2
(45) Date of Patent: Aug. 25, 2026

(54) DISPLAY DEVICE

(71) Applicant: SAMSUNG DISPLAY CO., LTD., Yongin-si (KR)

(72) Inventors: Kwang Soo Bae, Yongin-si (KR); Gun Hee Kim, Yongin-si (KR); Taekyung Ahn, Yongin-si (KR); Sanghwan Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 353 days.

(21) Appl. No.: 18/494,494

(22) Filed: Oct. 25, 2023

(65) Prior Publication Data

US 2024/0206240 A1 Jun. 20, 2024

(30) Foreign Application Priority Data

Dec. 20, 2022 (KR) ........................ 10-2022-0179384

(51) Int. Cl.
*H10K 59/122* (2023.01)
*G06F 3/044* (2006.01)
(Continued)

(52) U.S. Cl.
CPC ........... *H10K 59/122* (2023.02); *G06F 3/044* (2013.01); *G09G 3/3233* (2013.01); *H10K 59/40* (2023.02); *H10K 59/8792* (2023.02); *G09G 2300/0819* (2013.01); *G09G 2300/0842* (2013.01); *G09G 2300/0861* (2013.01)

(58) Field of Classification Search
CPC .. H10K 59/122; H10K 59/40; H10K 59/8792; H10K 59/65; H10K 59/12; H10K 39/34; H10K 59/131; H10K 59/87; H10K 59/873; H10K 59/35; H10K 59/38; H10K 59/80521; H10K 65/00
See application file for complete search history.

(56) References Cited

U.S. PATENT DOCUMENTS 10,516,004 B2 12/2019 Park et al.
12,096,659 B2 9/2024 Kamada et al.
(Continued)

FOREIGN PATENT DOCUMENTS

KR 10-2018-0079059 A 7/2018
KR 10-2021-0055699 A 5/2021

*Primary Examiner* — Syed I Gheyas
(74) *Attorney, Agent, or Firm* — F. CHAU & ASSOCIATES, LLC

(57) ABSTRACT

A display device includes a base layer, a circuit layer disposed on the base layer, and an element layer disposed on the circuit layer and including a plurality of light emitting elements and a light receiving element disposed between the light emitting elements. The element layer includes a pixel definition layer including a plurality of light emitting openings, each overlapping a corresponding light emitting element, and a light receiving opening overlapping the light receiving element, and a spacer layer disposed on the pixel definition layer and including a spacer opening and a bridge groove connected to the spacer opening and exposing a top surface of the pixel definition layer. The display device further includes a common layer commonly included in the light emitting elements and the light receiving element and partially disconnected by the spacer layer.

20 Claims, 15 Drawing Sheets

(51) Int. Cl.

*G09G 3/3233* (2016.01)
*H10K 59/40* (2023.01)
*H10K 59/80* (2023.01)

(56) References Cited

U.S. PATENT DOCUMENTS

| | | | | |
|---|---|---|---|---|
| 2012/0235146 | A1* | 9/2012 | Kim | H10K 59/8723 257/E29.273 |
| 2013/0075761 | A1* | 3/2013 | Akiyama | H10F 55/25 257/E31.095 |
| 2021/0005669 | A1* | 1/2021 | Kamada | H10K 59/40 |
| 2021/0066410 | A1* | 3/2021 | Jo | H10K 59/40 |
| 2021/0351250 | A1* | 11/2021 | Guo | H10K 59/121 |
| 2025/0359430 | A1* | 11/2025 | Jung | H10K 59/121 |

* cited by examiner

PXR
R_PD
EMLj
EMj
VL1
ELVDD
Cst
ET1
T1
T3
ET2
Id
Ibp
T5
VL4
VINT2
VINT1
VL3
T4
N1
T2
DLi
Di
SWLj
SWj
SCLj
SCj
SILj
SIj
SBLj
SBj
Ied
ED_R
ELVSS
VL2
FX
O_SD
RLd
FSd
ST3
ST2
SLVD
SN2
VL5
Vrst
ST1
SN1
RCL
RST
SWLj
SWj
LSU
OPD1
OPD2

DISPLAY DEVICE

CROSS-REFERENCE TO RELATED APPLICATIONS

This U.S. non-provisional patent application claims priority under 35 U.S.C. § 119 to Korean Patent Application No. 10-2022-0179384, filed on Dec. 20, 2022, the disclosure of which is incorporated by reference herein in its entirety.

TECHNICAL FIELD

Embodiments of the present inventive concept relate to a display device, and more particularly, to a display device capable of recognizing biometric information.

DISCUSSION OF RELATED ART

A display device may display an image to provide information to a user, or may provide various functions capable of communicating with a user, such as sensing an input of the user. A display device may also include functions that sense biometric information about a user.

Examples of biometric information recognition types include an electrostatic capacitive type that sense a change in electrostatic capacitance between electrodes, an optical type that sense incident light using an optical sensor, and an ultrasonic type that sense vibration using a piezoelectric material.

SUMMARY

Embodiments of the inventive concept provide a display device capable of increasing the sensing performance of a sensor for biometric information recognition.

An embodiment of the inventive concept provides a display device including a base layer, a circuit layer disposed on the base layer, and an element layer disposed on the circuit layer and including a plurality of light emitting elements and a light receiving element disposed between the light emitting elements. The element layer includes a pixel definition layer including a plurality of light emitting openings, each overlapping a corresponding light emitting element from among the plurality of light emitting elements, and a light receiving opening overlapping the light receiving element, and a spacer layer disposed on the pixel definition layer adjacent to the light receiving opening and including a spacer opening overlapping the light receiving opening and a bridge groove connected to the spacer opening and exposing a top surface of the pixel definition layer. The display device further includes a common layer commonly included in the light emitting elements and the light receiving element. The common layer does not overlap the spacer layer.

In an embodiment, the display device further includes a cathode electrode commonly included in the light emitting elements and the light receiving element, disposed on the common layer, and not overlapping the spacer layer.

In an embodiment, the common layer includes a hole control layer and an electron control layer, a portion, surrounding the spacer layer, of the common layer is connected to another portion, disposed in the spacer opening, of the common layer through the bridge groove, and a portion, surrounding the spacer layer, of the cathode electrode is connected to another portion, disposed in the spacer opening, of the common layer through the bridge groove.

In an embodiment, the spacer layer includes a bottom surface contacting the pixel definition layer, a top surface facing the bottom surface, and side surfaces connected to the bottom surface and the top surface. An angle between the bottom surface and each of the side surfaces is an obtuse angle.

In an embodiment, the spacer layer includes a first part disposed on the pixel definition layer, and a second part exposing a portion of the first part and disposed on the first part. A portion exposed by the second part in the first part is more adjacent to the light emitting elements than the light receiving element.

In an embodiment, the first part includes a bottom surface contacting the pixel definition layer, a first top surface exposed from the second part, a first side surface connected to the bottom surface and the first top surface and adjacent to light emitting areas, and a second surface adjacent to the light receiving element. The second part includes a second top surface, a third side surface connected to the first top surface and the second surface, and a fourth side surface connected to the first top surface and the second side surface. The second side surface and the fourth side surface are aligned with each other, and each of angles between the bottom surface and the first side surface, and the bottom surface and the second side surface is an obtuse angle.

In an embodiment, a width of the spacer layer is about 12 μm to about 18 μm.

In an embodiment, a width between the side surfaces of the spacer layer, which define the bridge groove, is about 3.5 μm to about 5 μm.

In an embodiment, separation distances from an outer edge of the spacer layer to the adjacent light emitting openings are the same.

In an embodiment, the light emitting elements generate a first color light, a second color light and a third color light that are different from each other, and the light emitting openings include a plurality of first light emitting openings through which the first color light is provided and which are spaced apart from each other in the first direction with the light receiving opening interposed therebetween, a second light emitting opening through which the second color light is provided, a third light emitting opening through which the third color light is provided and which is spaced apart from the second light emitting opening in a second direction crossing the first direction with the light receiving opening interposed therebetween. An area of the second light emitting opening is greater than those of the first light emitting openings and the third light emitting opening, the second light emitting opening is spaced apart from one of the first light emitting openings in a first diagonal direction crossing the first direction and the second direction, and the third light emitting opening is spaced apart from another one of the first light emitting openings in the first diagonal direction.

In an embodiment, the spacer layer is disposed between the first to third light emitting openings, and surrounds at least a portion of the light receiving opening.

In an embodiment, the bridge groove is disposed between the light receiving opening and the second light emitting opening, and extends in the second direction.

In an embodiment, the bridge groove includes a first groove disposed between the light receiving opening and the one first light emitting opening and extending in the second direction, a second groove connected to the first groove, disposed between the light receiving opening and the third light emitting opening, and extending in the first direction, and a third groove connected to the second groove and the spacer opening and extending in the second direction.

In an embodiment, the bridge groove includes a first groove disposed between the light receiving opening and the one first light emitting opening and extending in the second direction, a second groove connected to the first groove, disposed between the light receiving opening and the third light emitting opening, and extending in the first direction, a third groove connected to the second groove, disposed between the light receiving opening and the another one of the first light emitting openings, and extending in the second direction; a fourth groove connected to the third groove, disposed between the light receiving opening and the second light emitting opening, and extending in the first direction, and a fifth groove connected to the fourth groove and the spacer opening and extending in the second direction.

In an embodiment, the spacer layer further includes a body disposed between the first to third light emitting openings and surrounding at least a portion of the light receiving opening, and a plurality of protruding units, each disposed between the light emitting openings that provide different color light and extending from the body in a corresponding direction between the first diagonal direction and a second diagonal direction crossing the first diagonal direction.

In an embodiment, the bridge groove is disposed between the light receiving opening and the second light emitting opening and extends in the second direction.

In an embodiment, the bridge groove includes a diagonal groove included in a protruding unit among the plurality of protruding units disposed between the one first light emitting opening and the second light emitting opening, and extending in the second diagonal direction, a first groove connected to the diagonal groove, disposed between the light receiving opening and the one first light emitting opening, and extending in the second direction, a second groove connected to the first groove, disposed between the light receiving opening and the third light emitting opening, and extending in the first direction, and a third groove connected to the second groove and the spacer opening and extending in the second direction.

In an embodiment, the bridge groove includes a diagonal groove included in the protruding unit disposed between the one first light emitting opening and the second light emitting opening and extending in the second diagonal direction, a first groove connected to the diagonal groove, disposed between the light receiving opening and the one first light emitting opening, and extending in the second direction, a second groove connected to the first groove, disposed between the light receiving opening and the third light emitting opening, and extending in the first direction, a third groove connected to the second groove, disposed between the light receiving opening and the another one of the first light emitting openings, and extending in the second direction, a fourth groove connected to the third groove, disposed between the light receiving opening and the second light emitting opening, and extending in the first direction, and a fifth groove connected to the fourth groove and the spacer opening and extending in the second direction.

In an embodiment, the display device further includes an encapsulation layer disposed on the circuit layer and covering the light emitting elements and the light receiving elements, and an input sensor disposed on the encapsulation layer and including at least one sensing insulation layer and a conductive layer overlapping the pixel definition layer.

In an embodiment, the display device further includes a light control layer including a plurality of light blocking openings overlapping the light emitting openings and the light receiving opening, a light blocking layer overlapping the pixel definition layer and disposed on the input sensor, and a plurality of color filters disposed in the corresponding light blocking openings. A side surface of the light blocking layer that defines the light blocking openings overlapping the light emitting openings is more adjacent to a center of the pixel definition layer than another side surface of the light blocking layer that defines the light blocking opening overlapping the light receiving opening.

BRIEF DESCRIPTION OF THE DRAWINGS

The above and other features of the present inventive concept will become more apparent by describing in detail embodiments thereof with reference to the accompanying drawings.

DETAILED DESCRIPTION

Figure 1:
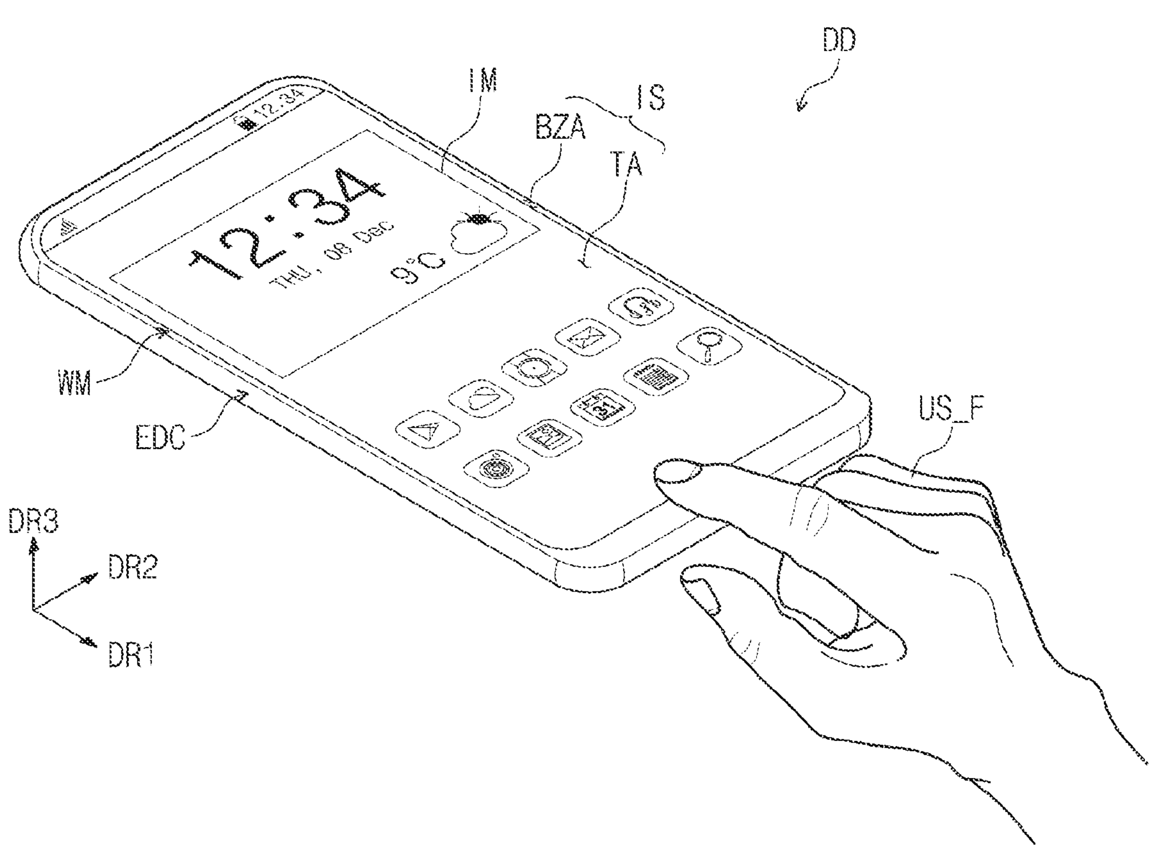
FIG. 1 is a perspective view of a display device according to an embodiment of the inventive concept.

Embodiments of the present inventive concept will be described more fully hereinafter with reference to the accompanying drawings. Like reference numerals may refer to like elements throughout the accompanying drawings.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

The term "and/or" includes any and all combinations of one or more of the associated items.

It will be understood that the terms "first," "second," "third," etc. are used herein to distinguish one element from another, and the elements are not limited by these terms. Thus, a "first" element in an embodiment may be described as a "second" element in another embodiment.

The singular expressions include plural expressions unless the context clearly dictates otherwise.

In addition, the terms such as "under", "lower", "on", and "upper" are used for explaining associations of items illustrated in the drawings. The terms are used as a relative concept and are described with reference to the direction indicated in the drawings.

It should be understood that the terms "comprise" or "have" are intended to specify the presence of stated features, integers, steps, operations, elements, components, or combinations thereof in the disclosure, but do not preclude the presence or addition of one or more other features, integers, steps, operations, elements, components, or combinations thereof.

Figure 2:
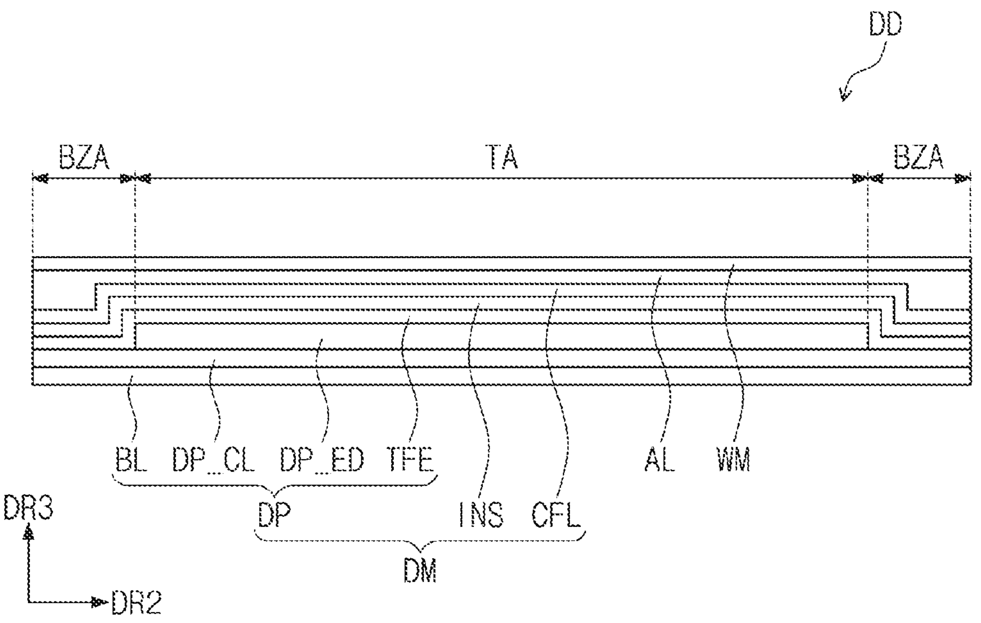
FIG. 2 is a cross-sectional view of a display device according to an embodiment of the inventive concept.

FIG. 1 is a perspective view of a display device according to an embodiment of the inventive concept. FIG. 2 is a cross-sectional view of a display device according to an embodiment of the inventive concept.

Referring to FIGS. 1 and 2, the display device DD according to an embodiment may have a rectangular shape having long sides extending in a first direction DR1, and having short sides extending in a second direction DR2 crossing the first direction DR1. However, embodiments are not limited thereto, and the display device DD may have various shapes such as, for example, a circular or polygonal shape.

The display device DD may be activated according to an electrical signal. The display device DD may have various embodiments. For example, the display device DD may be applied to an electronic device such as a smartwatch, tablet, laptop, desktop, smart television or the like.

Hereinafter, a normal direction substantially vertical to the plane defined by the first direction DR1 and the second direction DR2 is defined as a third direction DR3. In the specification, "when viewed in a plan view" may mean a state of being viewed in the third direction DR3.

The top surface of the display device DD may be defined as a display surface IS, and be parallel to the plane defined by the first direction DR1 and the second direction DR2. Images IM generated in the display device DD may be provided to a user through the display surface IS.

The display surface IS may be divided into a transmission area TA and a bezel area BZA. The transmission area TA may be an area in which the images IM is displayed. A user may visually recognize the images IM through the transmission TA. In an embodiment, the transmission area TA is illustrated as having a rectangular shape with round corners. However, this is merely an example, and the transmission area TA may have various shapes and is not limited to any one embodiment.

The bezel area BZA is adjacent to the transmission area TA. The bezel area BZA may have a prescribed color. The bezel area BZA may surround the transmission area TA. Accordingly, the shape of the image area TA may be substantially defined by the bezel area BZA. However, this is merely an example. The bezel area BZA may be disposed adjacent only to one side of the transmission area TA, or may be omitted.

The display device DD may detect an external input applied from outside of the display device DD. The external input may include various types of inputs provided from the outside of the display device DD. For example, the external input may include an external input (e.g. hovering) closely applied to or adjacently applied at a prescribed distance to the display device DD as well as contact by a portion, such as a hand US_F, of the user or a separate device (e.g. an active pen, digitizer or the like). In addition, the external input may have various types such as, for example, force, pressure, temperature, light, etc.

The display device DD may detect biometric information applied from outside of the display device DD. A biometric information sensing area, in which the biometric information about the user may be sensed, may be provided on the display surface IS of the display device DD. The biometric information sensing area may be provided in the entire area of the transmission area TA or provided in a partial area of the transmission area TA. In an embodiment, in FIG. 1, the entirety of the transmission area TA is shown as being used as the biometric information sensing area, but embodiments are not limited thereto. For example, in an embodiment, only a portion of the transmission area TA may be defined as the biometric information sensing area.

The display device DD may include a window WM, a display module DM, and a housing EDC. In an embodiment, the window WM and the housing EDC may be combined to provide the appearance of the display device DD.

The front surface of the window WM defines the display surface IS of the display device DD. The window WM may include an optically transparent insulation material. For example, the window WM may include glass or plastic. The window WM may have a multilayer structure or a single-layer structure. For example, the window WM may include a plurality of plastic films bonded with an adhesive, or include a glass substrate and a plastic film bonded with an adhesive.

The display module DM may include a display panel DP and an input sensor INS. The display panel DP displays an image in response to an electrical signal, and the input sensor INS may sense an external input applied from outside of the display device DD. The external input may be provided in various types.

The display panel DP according to an embodiment of the inventive concept may be an emissive display panel, but is not particularly limited. For example, the display panel DP may be an organic light emitting display panel or an inorganic light emitting display panel, or a quantum dot light emitting display panel. A light emitting layer of the organic light emitting display panel may include an organic light emitting material, and a light emitting layer of the inorganic light emitting display panel may include an inorganic light emitting material. A light emitting layer of the quantum dot light emitting display panel may include quantum dots, quantum rods, or the like. Hereinafter, the display panel DP will be described as the organic light emitting display panel.

Referring to FIG. 2, the display panel DP includes a base layer BL, a circuit layer DP-CL, an element layer DP-ED, and an encapsulation layer TFE. The display panel DP according to an embodiment of the inventive concept may be a flexible display panel DP. However, embodiments of the inventive concept are not limited thereto. For example, the display panel DP may be a foldable display panel that folds around a folding axis or a rigid display panel.

The base layer BL may include a synthetic resin layer. The synthetic resin layer may be, for example, a polyimide-based resin layer, but the material is not particularly limited. The base layer BL may include, for example, a glass substrate, a metal substrate, or an organic/inorganic composite material substrate, etc.

The circuit layer DP_CL is disposed on the base layer BL. The circuit layer DP_CL is disposed between the base layer BL and the element layer DP_ED. The circuit layer DP-CL includes at least one insulation layer and a circuit element. Hereinafter, the insulation layer included in the circuit layer DP-CL is referred to as an intermediate insulation layer. The intermediate insulation layer includes at least one intermediate inorganic film and at least one intermediate organic film. The circuit element may include, for example, a pixel driving circuit included in each of the plurality of pixels, a sensor driving circuit included in each of the plurality of sensors for recognizing external information, and the like.

The external information may be the biometric information. In an embodiment, the sensor may be a fingerprint recognition sensor, a proximity sensor, an iris recognition sensor or the like. In addition, the sensor may be an optical sensor configured to recognize the biometric information in an optical manner. The circuit layer DP_CL may further include signal lines connected to the pixel driving circuit and/or the sensor driving circuit.

The element layer DP_ED may include a light emitting element included in each of the pixels and a light receiving element included in each of the sensors. In an embodiment, the light receiving element may be a photodiode. The light receiving element may be a sensor configured to sense or react to light reflected by a finger of the user. The circuit layer DP_CL and the element layer DP_ED will be described in further detail below.

The encapsulation layer TFE encapsulates the element layer DP_ED. The encapsulation layer TFE may include at least one inorganic layer and at least one organic layer. The inorganic layer includes an inorganic material and may protect the pixel layer DP_ED from moisture/oxygen. The inorganic film may include, for example, a silicon nitride layer, a silicon oxynitride layer, a silicon oxide layer, a titanium oxide layer, an aluminum oxide layer or the like, but is not particularly limited thereto. The organic layer may include an organic material and protect the element layer DP_EL from foreign matter such as dust particles.

The input sensor INS, which may be a biometric sensor, may be provided on the display panel DP. The input sensor INS may be directly disposed on the encapsulation layer TFE. According to an embodiment of the inventive concept, the input sensor INS may be provided on the display panel DP in continuous processes. In other words, when the input sensor INS is directly disposed on the display panel DP, a separate adhesive member is not disposed between the input sensor INS and the encapsulation layer TFE in an embodiment. Alternatively, the adhesive member may be disposed between the input sensor INS and the display panel DP. In this case, the input sensor INS may not be manufactured in continuous processes with the display panel DP, and may be fixed on the top surface of the display panel DP by the adhesive member, after being manufactured through processes separate from the display panel DP.

The input sensor INS may sense an external input (e.g. a user touch) and change the sensing result to a prescribed input signal, and provide the input signal to the display panel DP. The input sensor INS may include a plurality of sensing electrodes that sense the external input. The sensing electrodes may sense the external input in an electrostatic capacitive manner. The display panel DP may receive the input signal from the input sensor INS and generate an image corresponding to the input signal.

The display module DM may further include a color filter layer CFL. In an embodiment, the color filter layer CFL may be disposed on the input sensor INS. However, embodiments of the inventive concept are not limited thereto. The color filter layer CFL may be disposed between the display panel DP and the input sensor INS. The color filter layer CFL may include a plurality of color filters and a black matrix.

The structures of the input sensor INS and the color filter layer CFL will be described in further detail below.

The display device DD according to an embodiment of the inventive concept may further include an adhesive layer AL. The window WM may be attached to the input sensor INS by the adhesive layer AL. The adhesive layer AL may include, for example, an optical clear adhesive, an optically clear adhesive resin, or a pressure sensitive adhesive RSA.

The housing EDC is combined with the window WM to provide a prescribed internal space. The display module DM may be accommodated in the internal space. The housing EDC may include a material having relatively high hardness. For example, the housing EDC may include a plurality of frames and/or plates including glass, plastic, metal, or a combination thereof. The housing EDC may stably protect components of the display device DD accommodated in the internal space from an external impact. In an embodiment, a battery module or the like configured to supply power and utilized for the overall operations of the display device DD may be disposed between the display module DM and the housing EDC.

Figure 3:
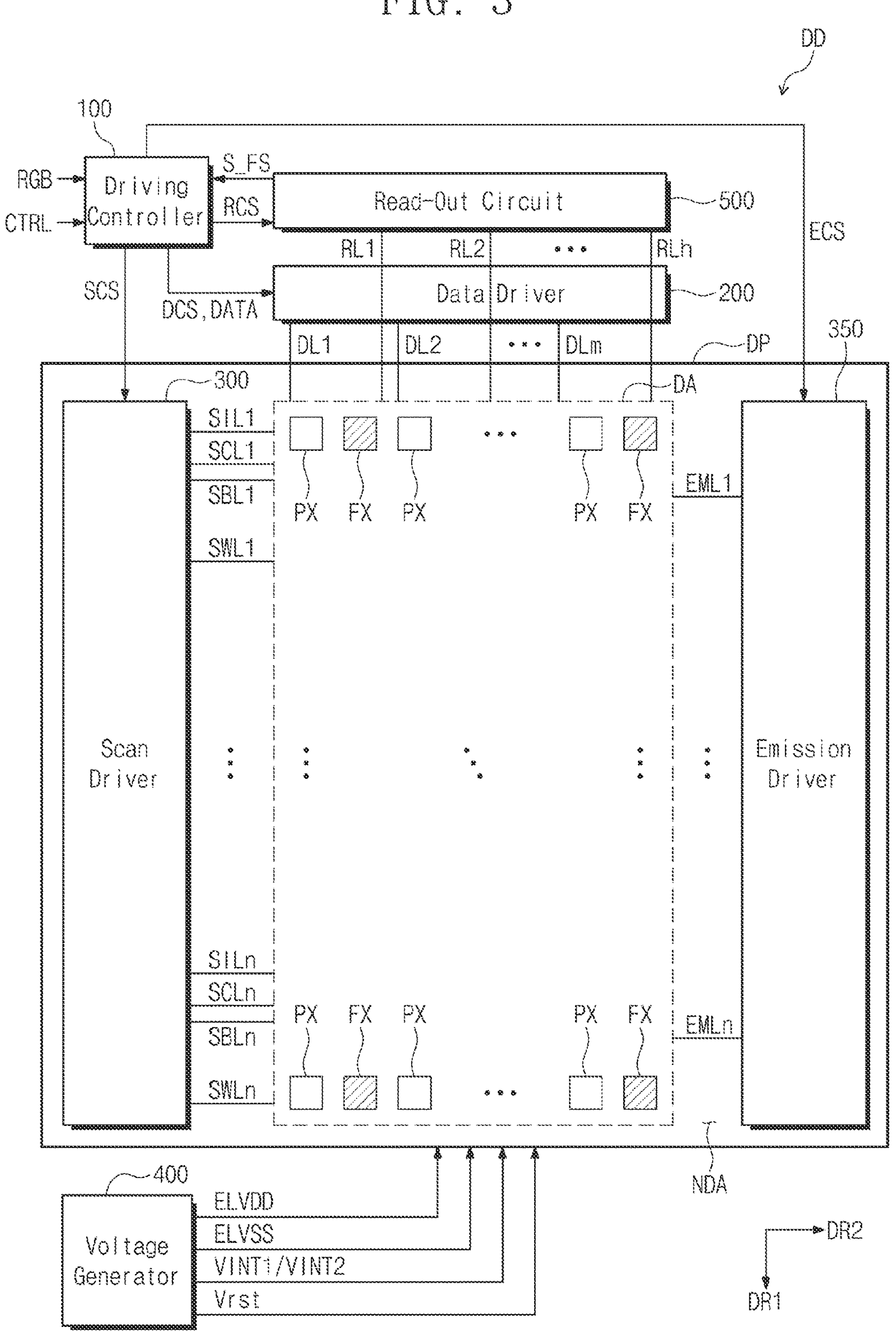
FIG. 3 is a block diagram of a display device according to an embodiment of the inventive concept.

FIG. 3 is a block diagram of a display device according to an embodiment of the inventive concept.

Referring to FIG. 3, the display device DD includes the display panel DP, a panel driver, and a driving controller 100. In an embodiment, the panel driver includes a data driver 200, a scan driver 300, an emission driver 350, a voltage generator 400, and a read-out circuit 500.

The driving controller 100 receives an image signal RGB and a control signal CTRL. The driving controller 100 generates an image data signal DATA by converting a data format of the image signal RGB to satisfy the interface specification with the data driver 200. The driving controller 100 may output a first control signal SCS, a second control signal ECS, a third control signal DCS and a fourth control signal RCS.

The data driver 200 may receive the third control signal DCS and the image data signal DATA from the driving controller 100. The data driver 200 converts the image data signal DATA into data signals, and outputs the data signals to a plurality of data lines DL1 to DLm to be described below, where m is a positive integer. The data signals are analog voltages corresponding to grayscale values of the image data signal DATA.

The scan driver 300 receives the first control signal SCS from the driving controller 100. The scan driver 300 may output scan signals to scan lines in response to the first control signal SCS.

The voltage generator 400 generates voltages utilized for operations of the display panel DP. In an embodiment, the voltage generator 400 generates a first driving voltage ELVDD, a second driving voltage ELVSS, a first initialization voltage VINT1, a second initialization voltage VINT2, and a reset voltage Vrst.

The display panel DP may include a display area DA corresponding to the transmission area TA (see FIG. 1) and a non-display area NDA corresponding to the bezel area BZA (see FIG. 1).

The display panel DP may include a plurality of pixels PX disposed in the display area DA and a plurality of sensors FX disposed in the display area DA. In an embodiment, each of the plurality of sensors FX may be disposed between two adjacent pixels PX. The plurality of pixels PX and the plurality of sensors FX may be alternately disposed in the first and second directions DR1, DR2. However, embodiments of the inventive concept are not limited thereto. In other words, two or more pixels may be disposed between two adjacent sensors FX in the first direction DR1 among the plurality of sensors FX, or between two adjacent sensors FX in the second direction among the plurality of sensors FX.

The display panel DP further includes initialization scan lines SIL1 to SILn, compensation scan lines SCL1 to SCLn, write scan lines SWL1 to SWLn, black scan lines SBL1 to SBLn, emission control lines EML1 to EMLn, the data lines DL1 to DLm, and read-out lines RL1 to RLh, where n and h are positive integers. The initialization scan lines SIL1 to SILn, the compensation scan lines SCL1 to SCLn, the write scan lines SWL1 to SWLn, the black scan lines SBL1 to SBLn, and the emission control lines EML1 to EMLn extend in the second direction DR2. The initialization scan lines SIL1 to SILn, the compensation scan lines SCL1 to SCLn, the write scan lines SWL1 to SWLn, the black scan lines SBL1 to SBLn, and the emission control lines EML1 to EMLn are spaced apart from each other in the first direction DR1. The data lines DL1 to DLm extend in the first direction DR1 and are arranged and spaced apart from each other in the second direction DR2.

The plurality of pixels PX are electrically connected to the initialization scan lines SIL1 to SILn, the compensation scan lines SCL1 to SCLn, the write scan lines SWL1 to SWLn, the black scan lines SBL1 to SBLn, the emission control lines EML1 to EMLn, the data lines DL1 to DLm, and the read-out lines RL1 to RLh. For example, each of the plurality of pixels PX may be electrically connected to four scan lines. However, the number of scan lines connected to each of the pixels PX is not limited thereto, and may vary.

The plurality of sensors FX are electrically connected to the write scan lines SWL1 to SWLn, and the read-out lines RL1 to RLh. Each of the plurality of sensors FX may be electrically connected to one scan line. However, embodiments of the inventive concept are not limited thereto. The number of scan lines connected to each of the sensors FX may vary. In an embodiment, the number of read-out lines RL1 to RLh may correspond to a half of the data lines DL1 to DLm. However, embodiments of the inventive concept are not limited thereto. Alternatively, the number of read-out lines RL1 to RLh may correspond to ¼ or ⅛ of the data lines DL1 to DLm.

The scan driver 300 may be disposed in the non-display area NDA of the display panel DP. The scan driver 300 receives the first control signal SCS from the driving controller 100. In response to the first control signal SCS, the scan driver 300 outputs initialization scan signals to the initializations scan lines GIL1 to GILn and outputs compensation scan signals to the compensation scan lines GCL1 SCL1 to SCLn. In addition, in response to the first control signal SCS, the scan driver 300 may output write scan signals to the write scan lines SWL1 to SWLn, and output black scan signals to the black scan lines SBL1 to SBLn. Alternatively, the scan driver 300 may include first and second scan drivers. The first scan driver may output the initialization scan signals and the compensation scan signals, and the second scan driver may output the write scan signals and the black scan signals.

The emission driver 350 may be disposed in the non-display area NDA of the display panel DP. The emission driver 350 receives the second control signal ECS from the driving controller 100. The emission driver 350C may output emission control signals to the emission control lines EL1 to ELn in response to the second control signal ECS. Alternatively, the scan diver 300C may be connected to the emission control lines EML1 to EMLn. In this case, the emission driver may be omitted, and the scan driver 300 may output the emission control signals to the emission control lines EML1 to EMLn.

The read-out circuit 500 receives the fourth control signal RCS from the driving controller 100. The read-out circuit 500 may receive sensing signals from the read-out lines RL1 to RLh in response to the fourth control signal RCS. The read-out circuit 500 may process the sensing signals received from the read-out lines RL1 to RLh, and provide the processed sensing signals S_FS to the driving controller 100. The driving controller 100 may recognize biometric information on the basis of the sensing signals S_FS.

Figure 4A:
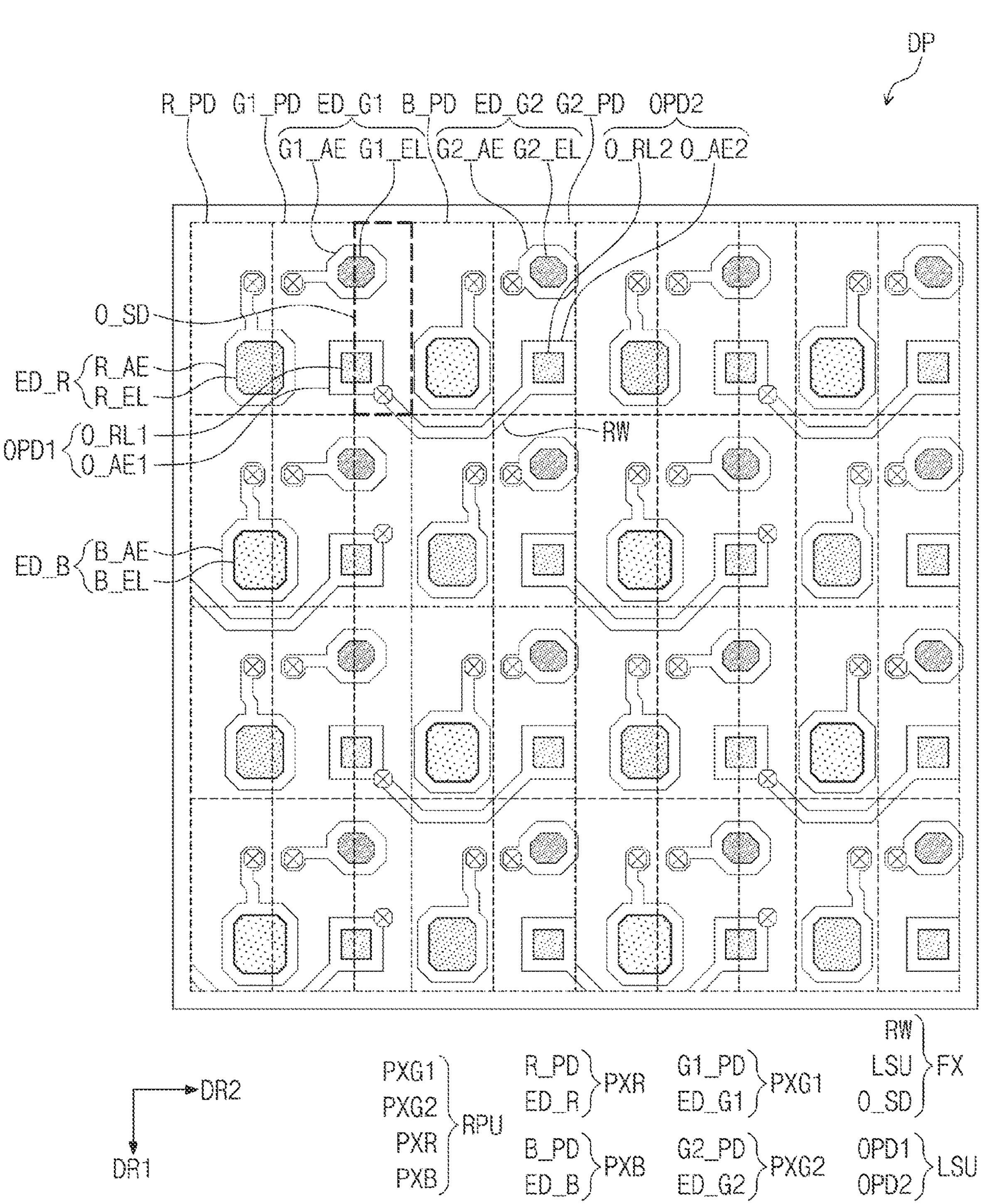
FIGS. 4A and 4B are enlarged plan views of a partial area of a display panel according to embodiments of the inventive concept.
Figure 4B:
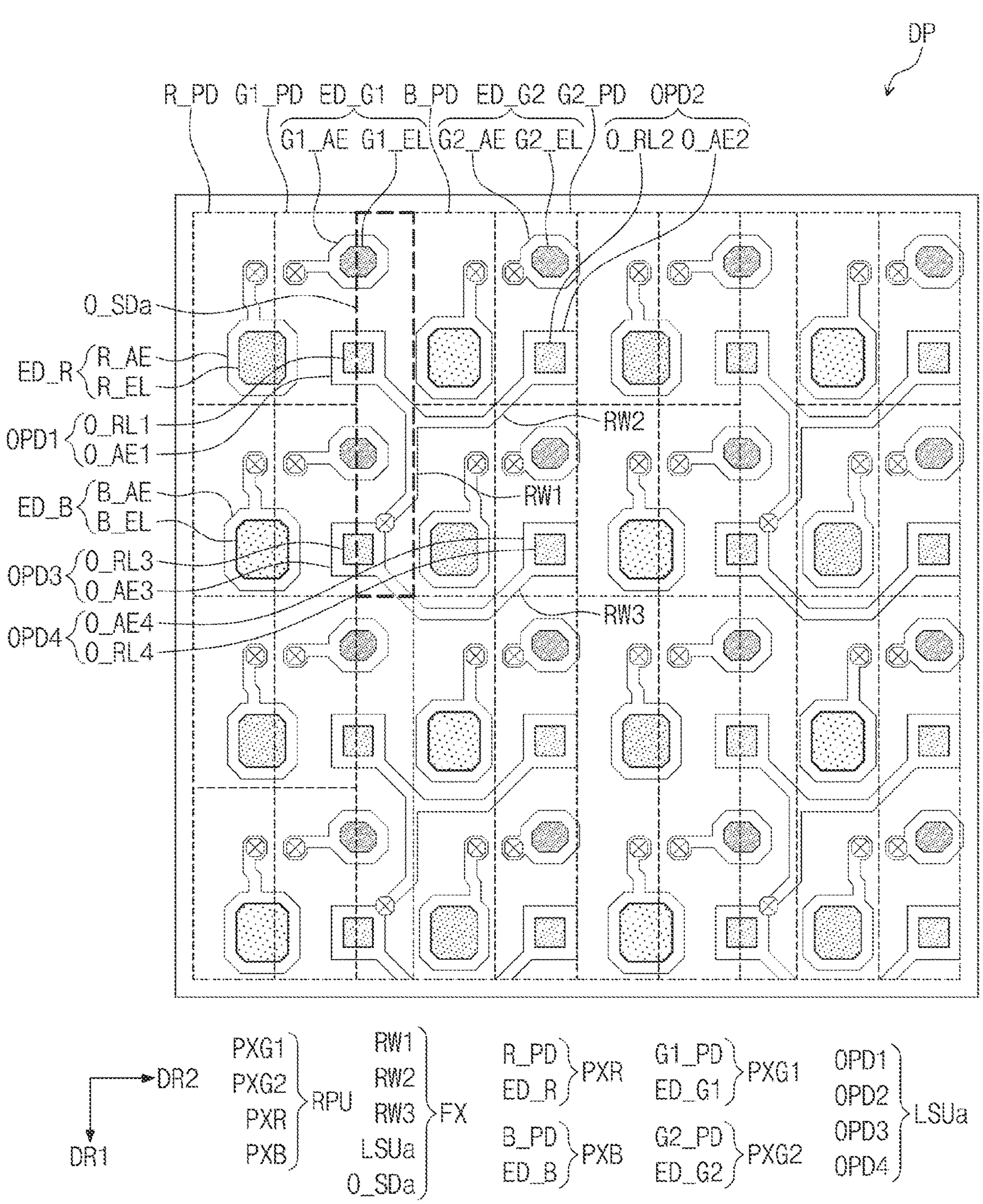

FIGS. 4A and 4B are enlarged plan views of a partial area of a display panel according to embodiments of the inventive concept.

Referring to FIG. 4A, the display panel DP includes a plurality of pixels PXR, PXG1, PXG2, PXB, and the plurality of sensors FX.

The plurality of pixels PXR, PXG1, PXG2, PXB may be grouped into a plurality of reference pixel units RPU. In an embodiment, each of the reference pixel units RPU may include four pixels, namely, two first pixels PXG2, PXG2 (hereinafter, first and second green pixels), a third pixel PXR (hereinafter, a red pixel), and a fourth pixel PXB (hereinafter, a blue pixel). However, the number of pixels included in each of the reference pixel units RPU is not limited thereto. Alternatively, each of the reference pixel units RPU may include three pixels, namely, the first green pixel PXG1 (or the second green pixel PXG2), the red pixel PXR, and the blue pixel PXB.

The first and second green pixels PXG1, PXG2 respectively include first and second light emitting elements ED_G1, ED_G2 (hereinafter, first and second green light emitting elements), the red pixel PXR includes a third light emitting element ED_R (hereinafter, a red light emitting element), and a blue pixel PXB includes a fourth light emitting element ED_B (hereinafter, a blue light emitting element). In an embodiment, each of the first and second green light emitting elements ED_G1, ED_G2 outputs first color light (e.g. green light), the red light emitting element ED_R outputs second color light (e.g. red light) different from the first color light, and the blue light emitting element ED_B outputs third color light (e.g. blue light) different from the first color light and the second color light. The green light output from the first green light emitting element ED_G1 may have the same wavelength band as the green light output from the second green light emitting element ED_G2.

In the first and second directions DR1, DR2, the red light emitting elements ED_R and the blue light emitting elements ED_B may be alternately repeatedly disposed. The first and second green light emitting elements ED_G1, ED_G2 are alternately repeatedly disposed in the first direction DR1, and alternately repeatedly disposed in the second direction DR2. The first and second green light emitting elements ED_G1, ED_G2 may be disposed in a different row and column from the blue light emitting elements ED_B in the first and second directions DR1, DR2.

In an embodiment, the red light emitting element ED_R may have a larger size than the first and second green light emitting elements ED_G1, ED_G2. In addition, the blue light emitting element ED_B may have an equal or larger size than the red light emitting element ED_R. The size of each of the light emitting elements ED_R, ED_G1, ED_G2, ED_B is not limited thereto, and may be modified in various ways. For example, in an embodiment of the inventive concept, the light emitting elements ED_R, ED_G1, ED_G2, ED_B may have the same size.

The first and second green light emitting elements ED_G1, ED_G2 may have a different shape from the red and blue light emitting elements ED_R, ED_B. In an embodiment, each of the red and blue light emitting elements ED_R, ED_B may have an octagonal shape having a longer length in the first direction DR1 than in the second direction DR2. The red and blue light emitting elements ED_R, ED_B may have the same size or different sizes, but have the same shape. The shape of each of the red and blue light emitting elements ED_R, ED_B is not limited thereto. For example, each of the red and blue light emitting elements ED_R, ED_B may have an octagonal shape having the same length in the first and second directions DR1, DR2, or have one of a square or rectangular shape.

Each of the first and second green light emitting elements ED_G1, ED_G2 may have an octagonal shape having a longer length in the second direction DR2 than in the first direction DR1. In an embodiment, the first and second green light emitting elements ED_G1, ED_G2 may have the same size and the same shape. However, the shapes of the first and second green light emitting elements ED_G1, ED_G2 are not limited thereto. Each of the first and second green light emitting elements ED_G1, ED_G2 may have an octagonal shape having the same length in the first and second directions DR1, DR2, or have one of a square or rectangular shape.

The first green light emitting element ED_G1 is electrically connected to a first green pixel driving circuit G1_PD. For example, the first green light emitting element ED_G1 includes a first green anode electrode G1_AE and a first green light emitting layer G1_EL, and the first green anode electrode G1_AE is connected to a first green pixel driving circuit G1_PD through a contact hole. The second green light emitting element ED_G2 is electrically connected to a second green pixel driving circuit G2_PD. For example, the second green light emitting element ED_G2 includes a second green anode electrode G2_AE and a second green light emitting layer G2_EL, and the second green anode electrode G2_AE is connected to a second green pixel driving circuit G2_PD through the contact hole.

The first green light emitting layer G1_EL and the second green light emitting layer G2_EL may have the same size. The first green light emitting layer G1_EL and the second green light emitting layer G2_EL may have the same shape or different shapes. In an embodiment, the first green light emitting layer G1_EL and the second green light emitting layer G2_EL may have different shapes on the same plane. The first green anode electrode G1_AE and the second green anode electrode G2_AE may have different sizes and different shapes.

The red light emitting element ED_R is electrically connected to a red pixel driving circuit R_PD. For example, the red light emitting element ED_R includes a red anode electrode R_AE and a red light emitting layer R_EL, and the red anode electrode R_AE is connected to the red pixel driving circuit R_PD through a contact hole. The blue light emitting element ED_B is electrically connected to a blue pixel driving circuit B_PD. For example, the blue light emitting element ED_B includes a blue anode electrode B_AE and a blue light emitting layer B_EL, and the blue anode electrode B_AE is connected to the blue pixel driving circuit B_PD through a contact hole.

Each of the sensors FX includes a light sensing unit LSU and a sensor driving circuit O_SD. The light sensing unit LSU may include at least one light receiving element. In an embodiment, the light sensing unit LSU includes k light receiving elements, and one of the k light receiving elements is connected to the sensor driving circuit. Here, k may be an integer of 2 or greater. FIG. 4A shows a case where k is 2. When k is 2, the light sensing unit LSU includes two light receiving elements (hereinafter, referred to as first and second light receiving elements OPD1, OPD2). In an embodiment, the two light receiving elements, namely, the first and second light receiving elements OPD1, OPD2 may be disposed corresponding to one reference pixel unit RPU. However, the number of the light receiving elements disposed corresponding to each of the reference pixel units RPU is not limited thereto. For example, one light receiving element may be disposed corresponding to each of the reference pixel units RPU.

Each of the first and second light receiving elements OPD1, OPD2 is disposed between the red and blue light emitting elements ED_R, ED_B in the second direction DR2. Each of the first and second light receiving elements OPD1, OPD2 may be disposed adjacent to the first green light emitting element ED_G1 or the second green light emitting element ED_G2 in the first direction DR1. In a first row of the reference pixel unit, the first light receiving element OPD1 and the first green light emitting element ED_G1 are adjacent in the first direction DR1, and the second light receiving element OPD2 and the second green light emitting element ED_G2 are adjacent in the first direction DR1. In a second row of the reference pixel unit, the first light receiving element OPD1 and the second green light emitting element ED_G2 are adjacent in the first direction DR1, and the second light receiving element OPD2 and the first green light emitting element ED_G1 are adjacent in the first direction DR1. In an embodiment, each of the first and second light receiving element OPD1, OPD2 are disposed between the adjacent first and second green light emitting elements ED_G1, ED_G2 in the first direction DR1.

Each of the first and second light receiving elements OPD1, OPD2 may have the same size and same shape. Each of the first and second light receiving elements OPD1, OPD2 may have a size smaller than the red and blue light emitting elements ED_R, ED_B. In an embodiment, each of the first and second light receiving elements OPD1, OPD2 may have an equal or smaller size than the first and second green light emitting elements ED_G1, ED_G2. However, the size of each of the first and second light receiving elements OPD1, OPD2 is not particularly limited, and may be modified in various ways. Each of the first and second light receiving elements OPD1, OPD2 may have a different shape from the red or blue light emitting elements ED_R, ED_B. In an embodiment, each of the first and second light receiving elements OPD1, OPD2 may have a square shape. The shape of each of the first and second light receiving element OPD1, OPD2 is not limited thereto. Alternatively, each of the first and second green light emitting elements OPD1, OPD2 may have a rectangular shape having a longer length in the first direction DR1 than in the second direction DR2.

The sensor driving circuit O_SD is connected to one (e.g. the first light receiving element OPD1) of the first and second light receiving elements OPD1, OPD2. The sensor driving circuit O_SD may have the same length as the red and blue pixel driving circuits R_PD, B_PD in the first direction DR1. The sensor driving circuit O_SD may overlap one (e.g. the first light receiving element OPD1) of the first and second light receiving elements OPD1, OPD2 in a plan view. The sensor driving circuit O_SD may overlap one (e.g. the first green light emitting element ED_G1) of the first and second green light emitting elements ED_G1, ED_G2 in a plan view.

The first light receiving element OPD1 includes a first sensing anode electrode O_AE1 and a first photoelectric conversion layer O_RL2, and the second light receiving element OPD2 includes a second sensing anode electrode O_AE2 and a second photoelectric conversion layer O_RL2. The first sensing anode electrode O_AE1 is directly connected to the sensor driving circuit O_SD through a contact hole.

Each of the sensors FX may further include a routing wiring RW electrically connecting the first and second light receiving elements OPD1, OPD2. The routing wiring RW is electrically connected to the first sensing anode electrode O_AE1 and the second sensing anode electrode O_AE2. In an embodiment, the routing wiring RW may be integrally provided with the first sensing anode electrode O_AE1 and the second sensing anode electrode O_AE2.

The routing wiring RW, the first sensing anode electrode O_AE1, and the second sensing anode electrode O_AE2 may be disposed on the same layer as the anode electrodes R_AE, G1_AE, G2_AE, B_AE. In this case, the routing RW, the first sensing anode electrode O_AE1, and the second sensing anode electrode O_AE2 may have the same material as the anode electrodes R_AE, G1_AE, G2_AE, B_AE, and be provided through the same processes.

The first and second light receiving elements OPD1, OPD2 may be connected to the sensor driving circuit O_SD in parallel by means of the routing wiring RW. Accordingly, the first and second light receiving elements OPD1, OPD2 may be substantially simultaneously turned on or off by the sensor driving circuit O_SD.

When k is 4 as shown in FIG. 4B, a light sensing unit LSUa may include four light receiving elements (hereinafter, referred to as first and fourth light receiving elements OPD1, OPD2, OPD3, OPD4). One (e.g. the third light receiving element OPD3) of the first to fourth light receiving elements OPD1, OPD2, OPD3, OPD4 is connected to a sensing driving circuit O_SDa.

Each of the sensors FX may further include three routing wirings (hereinafter, referred to as first to third routing wirings RW1, RW2, RW3) electrically connecting the first to fourth light receiving elements OPD1, OPD2, OPD3, OPD4. The first routing wiring RW1 electrically connects two adjacent light receiving elements (namely, the first and third light emitting elements OPD1, OPD3) in the first direction DR1 among the four light receiving elements OPD1, OPD2, OPD3, OPD4. The second routing wiring RW2 electrically connects two adjacent light receiving elements (namely, the first and second light emitting elements OPD1, OPD2) in the second direction DR2 among the four light receiving elements OPD1, OPD2, OPD3, OPD4. The third routing wiring RW3 electrically connects two adjacent light receiving elements (namely, the third and fourth light emitting elements OPD1, OPD4) in the second direction DR2 among the four light receiving elements OPD1, OPD2, OPD3, OPD4.

The first light receiving element OPD1 includes the first sensing anode electrode O_AE1 and the first photoelectric conversion layer O_RL2, and the second light receiving element OPD2 includes the second sensing anode electrode O_AE2 and the second photoelectric conversion layer O_RL2. The third light receiving element OPD3 includes a third sensing anode electrode O_AE3 and a third photoelectric conversion layer O_RL3, and the fourth light receiving element OPD4 includes a fourth sensing anode electrode O_AE4 and a fourth photoelectric conversion layer O_RL4. The third sensing anode electrode O_AE3 is directly connected to the sensor driving circuit O_SD through a contact hole. The sensor driving circuit O_SD may have a longer length than the red or blue pixel driving circuits R_PD, B_PD in the first direction DR1. Accordingly, the sensor driving circuit O_SDa may overlap two (e.g. the first and third light receiving elements OPD1, OPD3) of the first to fourth light receiving elements OPD1 to OPD4 in a plan view. The sensor driving circuit O_SDa may overlap two green light emitting elements (e.g. the first and second green light emitting elements ED_G1, ED_G2) in a plan view.

The first routing wiring RW1 is electrically connected to the first and third anode electrodes O_AE1, O_AE3, and the second routing wiring RW2 is electrically connected to the first and second anode electrodes O_AE1, O_AE2. The third routing wiring RW3 is electrically connected to the third and fourth sensing anode electrode O_AE3, O_AE4. In an embodiment, the first to third routing wirings RW1 to RW3 may be integrated with the first to fourth sensing anode electrodes O_AE1 to O_AE4.

The first to third routing wiring RW1 to RW3, and the first to fourth sensing anode electrode O_AE1 to O_AE4 may be disposed on the same layer as the anode electrodes R_AE, G1_AE, G2_AE, B_AE. In this case, the first to third routing wirings RW1 to RW3 and the first to fourth sensing anode electrodes O_AE1 to O_AE4 may have the same material as the anode electrodes R_AE, G1_AE, G2_AE, B_AE, and be provided through the same processes.

The first to fourth sensing anode electrodes O_AE1 to O_AE4 may be connected to the sensor driving circuit O_SDa in parallel by means of the first to third routing wirings RW1 to RW3. Accordingly, the first to fourth light receiving elements OPD1, OPD2, OPD3, OPD4 may be substantially simultaneously turned on or off by the sensor driving circuit O_SDa.

The sensor driving circuits O_SD, O_SDa may include a plurality of transistors. In an embodiment, the sensor driving circuits O_SD, O_SDa and the pixel driving circuits R_PD, G1_PD, G2_PD, B_PD may be concurrently provided through the same processes. In addition, the scan driver 300 (see FIG. 3) may include transistors provided through the same processes as the sensor driving circuits O_SD, O_SDa and the pixel driving circuits R_PD, G1_PD, G2_PD, B_PD.

Figure 5A:
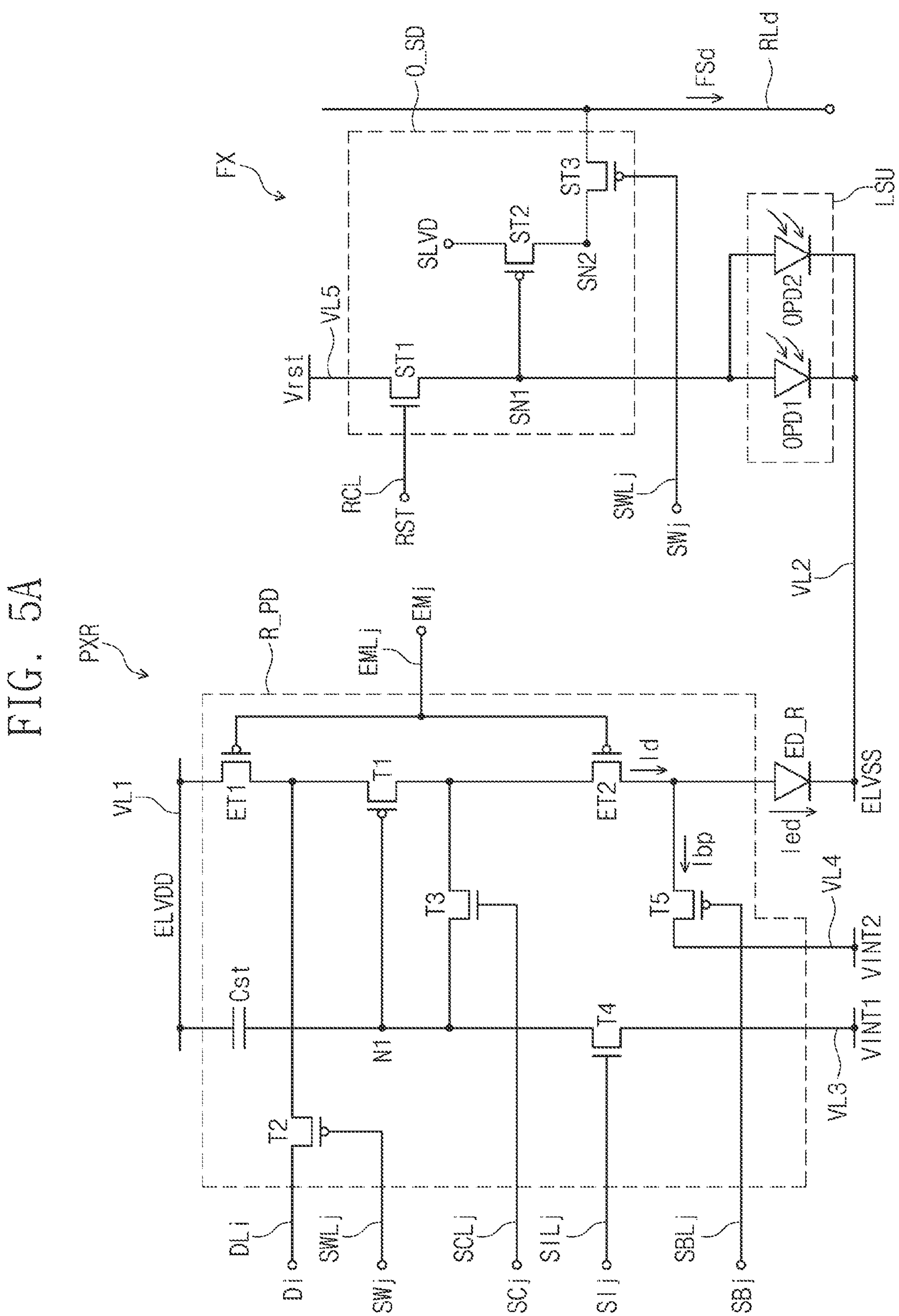
FIG. 5A is a circuit diagram showing a pixel and a sensor according to an embodiment of the inventive concept.
Figure 5B:
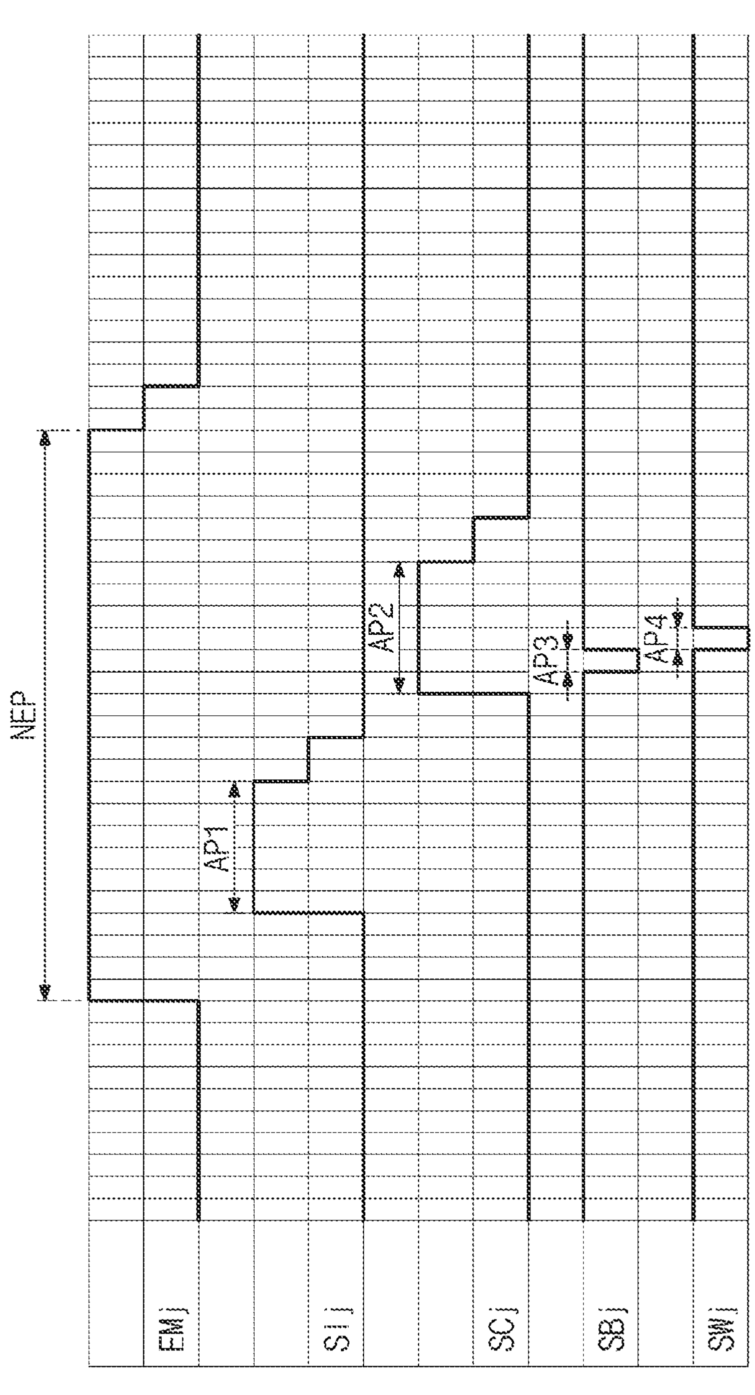
FIG. 5B is a waveform diagram for explaining the operations of the pixel and sensor shown in FIG. 5A.

FIG. 5A is a circuit diagram showing a pixel and a sensor according to an embodiment of the inventive concept. FIG. 5B is a waveform diagram for explaining the operations of the pixel and sensor shown in FIG. 5A.

FIG. 5A shows an example equivalent circuit diagram of one (e.g. the red pixel PXR) of the plurality of pixels PX shown in FIG. 3. Since the plurality of pixels PX have the same circuit structure, the description of the circuit structure of the red pixel PXR may also be applied to the other pixels, and for convenience of explanation, a detailed description of the other pixels will be omitted. In addition, FIG. 5A shows an example equivalent circuit diagram of one of the plurality of sensors FX shown in FIG. 3. Since the plurality of sensors FX has the same circuit structure, the description of the circuit structure of the sensor FX may also be applied to the other sensors, and for convenience of explanation, a detailed description of the other sensors will be omitted.

Referring to FIG. 5A, the red pixel PXR is connected to an i-th data line DLi among the data lines DL1 to DLm, a j-th initialization scan line SILj among the initialization scan lines SIL1 to SILn, a j-th compensation scan line SCLj among the compensation scan lines SCL1 to SCLn, a j-th write scan line SWLj among the write scan lines SWL1 to SWLn, a j-th black scan line SBLj among the black scan lines SBL1 to SBLn, and a j-th emission control line EMLj among the emission control lines EML1 to EMLn, where i, m, j and n are positive integers.

The red pixel PXR includes a red light emitting element ED_R and a red pixel driving circuit R_PD. The red light emitting element ED_R may be a light emitting diode. In an embodiment, the red light emitting element ED_R may be an organic light emitting diode including an organic light emitting layer.

The red pixel driving circuit R_PD includes first to fifth transistors T1, T2, T3, T4, T5, first and second emission control transistors ET1, ET2, and one capacitor Cst. At least one of the first to fifth transistors T1, T2, T3, T4, T5 and first and second emission control transistors ET1, ET2 may be a transistor having a low-temperature polycrystalline silicon (LTPS) semiconductor layer. Some of the first to fifth transistors T1, T2, T3, T4, T5 and first and second emission control transistors ET1, ET2 may be P-type transistors, and the others may be N-type transistors. For example, the first, second and fifth transistors T1, T2 and T5, and the first and second emission control transistors ET1 and ET2 may be PMOS transistors, and the third and fourth transistors T3 and T4 may be NMOS transistors. At least one of the first to fifth transistors T1, T2, T3, T4, T5 and the first and second emission control transistors ET1, ET2 may be a transistor having an oxide semiconductor layer. For example, the third and fourth transistors T3 and T4 may be oxide semiconductor transistors, and the first, second, fifth transistors T1, T2, T5, and the first and second emission control transistors ET1, ET2 may be LTPS transistors.

The configuration of the red pixel driving circuit R_PD according to an embodiment of the inventive concept is not limited to the embodiment shown in FIG. 5A. The red pixel driving circuit R_PD shown in FIG. 5A is merely an example, and the configuration of the red pixel circuit unit R_PD may be modified. For example, all of the first to fifth transistors T1, T2, T3, T4, T5 and the first and second emission control transistors ET1, ET2 may be P-type transistors or N-type transistors.

The j-th initialization scan line SILj, the j-th compensation scan line SCLj, the j-th write scan line SWLj, the j-th black scan line SBLj, and the j-th emission control line EMLj may respectively transfer, to the red pixel PXR, a j-th initialization scan signal SIj, a j-th compensation scan signal SCj, a j-th write scan signal SWj, a j-th black scan signal SBj, and a j-th emission control signal EMj. The i-th data line DLi transfers an i-th data signal Di to the red pixel PXR. The i-th data signal Di may have a voltage level corresponding to the image signal RGB (see FIG. 3) input to the display device DD (see FIG. 3).

The first and second driving voltage lines VL1 and VL2 may respectively transfer the first voltage ELVDD and the second driving voltage ELVSS to the red pixel PXR. In addition, the first and second initialization voltage lines VL3 and VL4 may respectively transfer the first initialization voltage VINT1 and the second initialization voltage VANIT to the red pixel PXR.

The first transistor T1 is connected between the first driving voltage line VL1 configured to receive the first driving voltage ELVDD and the red light emitting element ED_R. The first transistor T1 includes a first electrode connected to the first driving voltage line VL1 via the first emission control transistor ET1, a second electrode connected to the red anode electrode R_AE (see FIG. 4A) of the red light emitting diode ED_R via the second emission control transistor ET2, and a third electrode (e.g. a gate electrode) connected to one end (e.g. a first node N1) of the capacitor Cst. The first transistor T1 may receive the i-th data signal Di transferred through the i-th data line DLi according to a switching operation of the second transistor T2, and provide a driving current Id to the red light emitting element ED_R.

The second transistor T2 is connected between the data line DLi and the first electrode of the first transistor T1. The second transistor T2 includes a first electrode connected to the data line DLi, a second electrode connected to the first electrode of the first transistor T1, and a third electrode (e.g. a gate electrode) connected to the j-th write scan line SWLj. The second transistor T2 may be turned on in response to the write scan signal SWj transferred via the j-th write scan line SWLj to transfer the i-th data signal Di from the i-th data line DLi to the first electrode of the first transistor T1.

The third transistor T3 is connected between the second electrode of the first transistor T1 and the first node N1. The third transistor T3 may include a first electrode connected to the third electrode of the first transistor T1, a second electrode connected to the second electrode of the first transistor T1, and a third electrode (e.g. a gate electrode) connected to the j-th compensation scan line SCLj. The third transistor T3 may be turned on in response to the j-th compensation scan signal SCLj transferred via the j-th compensation scan line SCLj to connect the third electrode and the second electrode of the first transistor T1, and thus, the first transistor T1 may be diode-connected.

The fourth transistor T4 is connected between the first initialization voltage line VL3 through which the first initialization voltage VINT1 is applied and the first node N1. The fourth transistor T4 may include a first electrode connected to the first initialization line VL3 through which the first initialization voltage VINT1 is transferred, a second electrode connected to the first node N1, and a third electrode connected to the j-th initialization scan line SILj. The fourth transistor T4 is turned on in response to the j-th initialization scan signal SIj transferred via the j-th initialization scan line SILj. The turned-on fourth transistor T4 transfers the first initialization voltage VINT1 to the first node N1 to initialize a potential of the third electrode of the first transistor T1 (e.g., the potential of the first node N1).

The first emission control transistor ET1 includes a first electrode connected to the driving voltage line VL1, a second electrode connected to the first electrode of the first transistor T1, and a third electrode (e.g. a gate electrode) connected to the j-th emission control line EMLj.

The second emission control transistor ET2 may include a first electrode connected to the second electrode of the first transistor T1, a second electrode connected to the red anode electrode R_AE (see FIG. 4A) of the red light emitting element ED_R, and a third electrode (e.g. a gate electrode) connected to the j-th emission control line EMLj.

The first and second emission control transistors ET1, ET2 may be substantially simultaneously turned on in response to the j-th emission control signal EMj transferred via the j-th emission control line EMLj. The first driving voltage ELVDD applied through the turned-on first transistor ET1 may be compensated through the diode-connected first transistor T1 to be transferred to the red light emitting element ED_R.

The fifth transistor T5 may include a first electrode connected to the second initialization line VL4 through which the second initialization voltage VINT2 is transferred, a second electrode connected to the second electrode of the second emission control transistor ET2, and a third electrode (e.g. a gate electrode) connected to the j-th black scan line SBLj. The second initialization voltage VINT2 may have a voltage level lower than or equal to the first initialization voltage VINT1.

As described above, the one end of the capacitor Cst is connected to the third electrode of the first transistor T1, and the other end is connected to the first driving voltage line VL1. A cathode electrode of the red light emitting element ED_R may be connected to the second driving voltage line VL2 configured to transfer the second driving voltage ELVSS. The second driving voltage ELVSS may have a lower voltage level than the first driving voltage ELVDD. In an embodiment, the second driving voltage ELVSS may have a lower voltage level than the first and second initialization voltage VINT1, VINT2.

Referring to FIGS. 5A and 5B, the j-th emission control signal EMj has a high level during a non-emission period NEP. In the non-emission period NEP, the j-th initialization scan signal SIj is activated. During an activation period (hereinafter, a first activation period) of the j-th initialization scan signal SIj, if the j-th initialization scan signal SIj of a high level is applied through the j-th initialization scan line SIj, the fourth transistor T4 is turned on in response to the j-th initialization scan signal SIj of a high level. The first initialization voltage VINT1 is transferred to the third electrode of the first transistor T1 through the turned-on fourth transistor T4, and the first node N1 is initialized with the first initialization voltage VINT1. Accordingly, the first activation period AP1 may be defined as an initialization period of the red pixel PXR.

Then, the j-th compensation scan signal SCj is activated, and, during an activation period AP2 (hereinafter, a second activation period) of the j-th compensation scan signal SCj, the third transistor T3 is turned on, when the j-th compensation scan signal SCj of a high level is applied through the j-th compensation scan line SCLj. The first transistor T1 is diode-connected and biased in a forward direction by the turned-on third transistor T3. In an embodiment, the first activation period AP1 does not overlap the second activation period AP2.

The j-th write scan signal SWj is activated within the second activation period AP2. The j-th write scan signal SWj has a low level during an activation period AP4 (hereinafter, a fourth activation period). During the fourth activation period AP4, the second transistor T2 is turned on by the j-th write scan signal SWj of a low level. Then, a compensation voltage "Di-Vth", which is reduced by a threshold voltage Vth of the first transistor T1 from the i-th data signal Di supplied from the i-th data line DLi, is applied to the third electrode of the first transistor T1. In other words, a potential of the third electrode of the first transistor T1 may be the compensation voltage "Di-Vth". The fourth activation period AP4 may overlap the second activation period AP2. The duration of the second activation period AP2 may be larger than that of the fourth activation period AP4.

The first driving voltage ELVDD and the compensation voltage "Di-Vth" are applied to both ends of the capacitor Cst, and charges corresponding to the voltage difference between both ends may be stored in the capacitor Cst. Here, a high level period of the j-th compensation scan signal SCj may be referred to as a compensation period of the red pixel PXR.

In an embodiment, the j-th black scan signal SWj is activated within the activation period AP2 of the j-th compensation scan signal SCj. The j-th black scan signal SBj has a low level during an activation period AP3 (hereinafter, a third activation period). During the third activation period AP3, the fifth transistor T5 is turned on by receiving the j-th black scan signal SBj of a low level through the j-th black scan line SBLj. A portion of the driving current Id may pass from the fifth transistor T5 as a bypass current Ibp. The third activation period AP3 may overlap the second activation period AP2. The duration of the second activation period AP2 may be larger than that of the third activation period AP3. The third activation period AP3 may precede the fourth activation period AP4, and not overlap the fourth activation period AP4.

When the red pixel PXR displays a black image, even when a minimum driving current of the first transistor T1 flows as the driving current Id, the red pixel PXR may not normally display the black image, if the red light emitting element ED_R emits light. Accordingly, the fifth transistor T5 in the red pixel PXR according to an embodiment of the inventive concept may distribute, as the bypass current Ibp, a portion of the minimum driving current of the first transistor T1 to a current path other than a current path of a red light emitting element ED_R side. Here, the minimum current of the first transistor T1 means a current flowing to the first transistor T1 under a condition that a gate-source voltage Vgs of the first transistor T1 is smaller than the threshold voltage Vth to turn off the first transistor T1. Under this condition that the first transistor T1 is turned off, the minimum driving current (for example, the current of 10 pA or smaller) flowing to the first transistor T1 is transferred to the red light emitting element ED_R to display an image of black gray level. When the red pixel PXR displays the black image, the bypass current Ibp relatively significantly influences the minimum driving current. However, when a typical image or a white image is displayed, the bypass current Ibp may barely influence the driving current Id. Accordingly, when the black image is displayed, a current (namely, the emission current led) that the driving current Id is reduced by the amount of the bypass current Ibp output from the fifth transistor T5 is provided to the red light emitting element ED_R to clearly represent the black image. Accordingly, the red pixel PXR may implement an accurate black gray level image using the fifth transistor T5, and thus, the contrast ratio may be improved.

Then, the j-th emission control signal EMj applied from the j-th emission control line EMLj changes from the high level to a low level. The first and second transistors ET1, ET2 are turned on by the emission control signal EMj of a low level. Then, the driving current Id is generated according to the difference between the voltage of the third electrode of the first transistor T1 and the first driving voltage ELVDD, and the driving current Id is supplied to the red light emitting element ED_R through the second emission control ET2 to cause the current Ied to flow to the red light emitting element ED_R.

Referring to FIG. 5A again, the sensor FX is connected to a d-th read-out line RLd among the read-out lines RL1 to RLh, the j-th write scan line SWLj, and the reset control line RCL, where d is a positive integer.

The sensor FX includes a light sensing unit LSU and the sensor driving circuit O_SD. The light sensing unit LSU may include k light receiving elements connected in parallel to each other. When k is 2, the first and second light receiving elements OPD1, OPD2 may be connected in parallel. When k is 4, the first to fourth light receiving elements OPD1 to OPD4 (see FIG. 4B) may be connected in parallel. Each of the first and second light receiving elements OPD1, OPD2 may be a photodiode. In an embodiment, each of the first and second light receiving elements OPD1, OPD2 may be an organic photodiode having a photoelectric conversion layer including an organic material.

The first and second sensing anode electrodes O_AE1, O_AE2 (see FIG. 4A) of the first and second light receiving elements OPD1, OPD2 may be connected to the first sensing node SN1, and the first and second sensing cathode electrodes of the first and second light receiving elements OPD1, OPD2 may be connected to the second driving voltage line VL2 configured to transfer the second driving voltage ELVSS. The first and second sensing cathode electrodes may be electrically connected to the cathode electrodes of the light emitting elements ED_R, ED_G1, ED_G2, ED_B (see FIG. 4A). In an embodiment, the first and second sensing cathode electrodes may be integrated with the cathode electrodes of the light emitting elements ED_R, ED_G1, ED_G2, ED_B to provide a common cathode electrode C_CE (see FIG. 7A). In an embodiment, the cathode electrode is commonly included in (or formed in) the light emitting elements ED_R, ED_G1, ED_G2, ED_B and the light receiving element OPD, is disposed on the common layer, and does not overlap the spacer layer SPC.

The sensor driving circuit O_SD includes three transistors ST1 to ST3. The three transistors ST1 to ST3 may be a reset transistor ST1, an amplification transistor ST2, and an output transistor ST3. At least one of the reset transistor ST1, the amplification transistor ST2, and the output transistor ST3 may be an oxide semiconductor transistor. In an embodiment, the reset transistor ST1 may be an oxide semiconductor transistor, and the amplification transistor ST2 and the output transistor ST3 may be LTPS transistors. However, embodiments of the inventive concept are not limited thereto, and at least the reset transistor ST1 and the output transistor ST3 may be oxide semiconductor transistors, and the amplification transistor ST2 may be an LTPS transistor.

In addition, some of the reset transistor ST1, the amplification transistor ST2, and the output transistor ST3 may be P-type transistors, and the others may be N-type transistors. In an embodiment, the amplification transistor ST2 and the output transistor ST3 may be PMOS transistors, and the reset transistor ST1 may be an NMOS transistor. However, embodiments are not limited thereto. For example, in an embodiment, all of the reset transistor ST1, the amplification transistor ST2, and the output transistor ST3 may be N-type transistors or P-type transistors.

Some (e.g. the reset transistor ST1) of the reset transistor ST1, the amplification transistor ST2, and the output transistor ST3 may be the same type transistor as the third and fourth transistors T3, T3 of the red pixel PXR. The amplification transistor ST2 and the output transistor ST3 may be the same type of transistor as the first, second, and fifth transistors T1, T2, T5 of the red pixel PXR and the first and second emission control transistors ET1, ET2.

The circuit configuration of the sensor driving circuit O_SD according to embodiments of the inventive concept is not limited to that shown in FIG. 5A. The sensor driving circuit O_SD shown in FIG. 5A is merely an example, and the configuration of the sensor driving circuit O_SD may be modified.

The reset transistor ST1 includes a first electrode configured to receive a reset voltage Vrst, a second electrode connected to the first sensing node SN1, and a third electrode configured to receive a reset control signal RST. The reset transistor ST1 may reset a potential of the first sensing node SN1 to the reset control signal RST in response to the reset control signal RST. The reset control signal RST may be a signal provided through a reset control line RCL. However, embodiment of the present inventive concept are not limited hereto. Alternatively, the reset control signal RST may be the j-th compensation scan signal SCj supplied through the j-th compensation scan line SCLj. In other words, the reset transistor ST1 may receive, as the reset control signal RST, the j-th compensation scan signal SCj supplied from the j-th compensation scan line SCLj. In an embodiment, the reset voltage Vrst may have a voltage level smaller than the second driving voltage ELVSS during at least an activation period of the reset control signal RST. The reset voltage Vrst may be a DC voltage maintained at a voltage level smaller than the second driving voltage ELVSS.

The reset transistor ST1 may include a plurality of sub-reset transistors that are serially connected. For example, the reset transistor ST1 may include two sub-reset transistors (hereinafter, first and second sub-reset transistors). In this case, a third electrode of the first sub-reset transistor and a third electrode of the second sub-reset transistor are connected to the reset control line RCL. In addition, a second electrode of the first sub-reset transistor and a first electrode of the second sub-reset transistor may be electrically connected to each other. In addition, the reset voltage Vrst may be applied to the first electrode of the first sub-reset transistor, and the second electrode of the second sub-reset transistor may be electrically connected to the first sensing node SN1. However, the number of the sub-reset transistors is not limited thereto, and may be modified in various ways.

The amplification transistor ST2 includes a first electrode configured to receive the sensing driving voltage SLVD, a second electrode connected to the second sensing node SN2, and a third electrode connected to the first sensing node SN1. The amplification transistor ST2 may be turned on according to the potential of the first sensing node SN1 to apply the sensing driving voltage SLVD to the second sensing node SN2. In an embodiment, the sensing driving voltage SLVD may be one of the first driving voltage ELVDD and the first and second initialization voltages VINT1, VINT2. When the sensing driving voltage SLVD is the first driving voltage ELVDD, the first electrode of the amplification transistor ST2 may be electrically connected to the first driving voltage line VL1. When the sensing driving voltage SLVD is the first initialization voltage VINT1, the first electrode of the amplification transistor ST2 may be electrically connected to the first initialization voltage line VL3, and when the sensing driving voltage SLVD is the second initialization voltage VINT2, the first electrode of the amplification transistor ST2 may be electrically connected to the second initialization voltage line VL4.

The output transistor ST3 includes a first electrode connected to the second sensing node SN2, a second electrode connected to the d-th read-out line RLd, and a third electrode configured to receive an output control signal. The output transistor ST3 may transfer a sensing signal Fsd to the read-out line RLD in response to the output control signal. The output control signal may be the j-th write scan signal SWj supplied through the j-th write scan line SWLj. In other words, the output transistor ST3 may receive, as the output control signal, the j-th write scan signal SWj supplied from the j-th write scan line SWLj.

The light sensing unit LSU of the sensor FX may be exposed to light during emission periods of the light emitting elements ED_R, ED_G1, ED_G2, ED_B (see FIG. 4A). The light may be output from any one of the light emitting elements ED_R, ED_G1, ED_G2, ED_B (see FIG. 4A).

When the user hand US_F (see FIG. 1) touches the display surface, the first and second light receiving elements OPD1, OPD2 may generate charges corresponding to light reflected by ridges of the finger or valleys between the ridges, and the light charges may be accumulated at the first sensing node SN1.

The amplification transistor ST2 may be a source-follower amplifier configured to generate a source-drain current in proportion to the charge amount of the first sensing node SN1, which is input to the third electrode.

During the fourth activation period AP4, the j-th write scan signal SWj of a low level is supplied through the j-th write scan line SWLj to the output transistor DT3. When the output transistor ST3 is turned on in response to the j-th write scan signal SWj of a low level, the sensing signal Fsd corresponding to the current flowing through the amplification transistor ST2 may be output to the d-th read-out line RLd.

Then, when the reset control signal RST of a high level is supplied through the reset control line RCL during the reset period, the reset transistor ST1 is turned on. The reset period may be defined as an activation period (namely, a high level period) of the reset control line RCL. Alternatively, when the reset transistor ST1 is a PMOS transistor, the reset control signal RST of a low level may be supplied to the reset control line RCL during the reset period. During the reset period, the first sensing node SN1 may be reset to a potential corresponding to the reset voltage Vrst. In an embodiment, the reset voltage Vrst may have a lower voltage level than the second driving voltage ELVSS.

Then, when the reset period is terminated, the light sensing unit LSU generates light charges corresponding to the received light, and the generated light charges may be accumulated at the first sensing node SN1.

Figure 6:
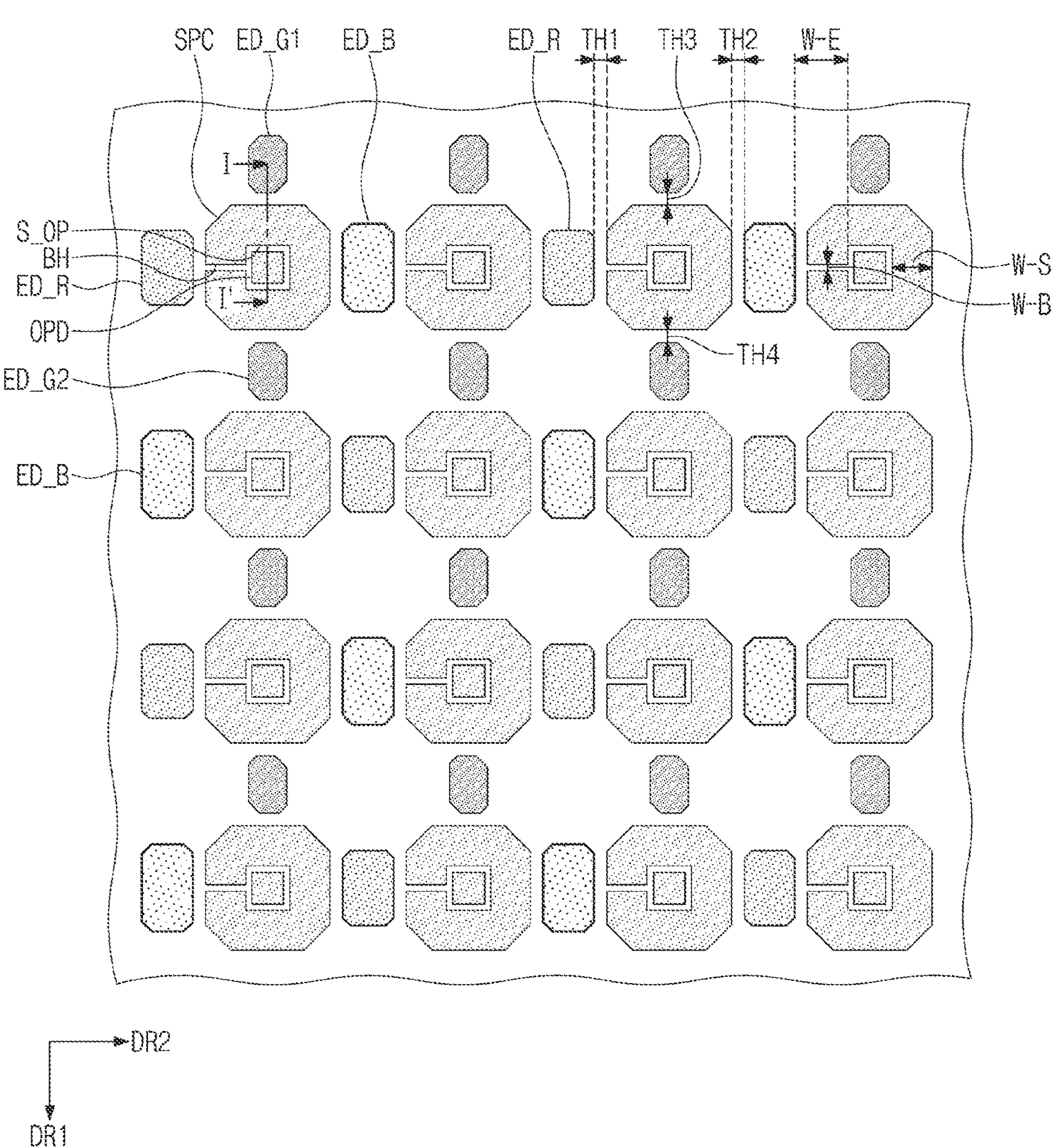
FIG. 6 is an enlarged plan view of a partial area of a display panel according to an embodiment of the inventive concept.
Figure 7A:
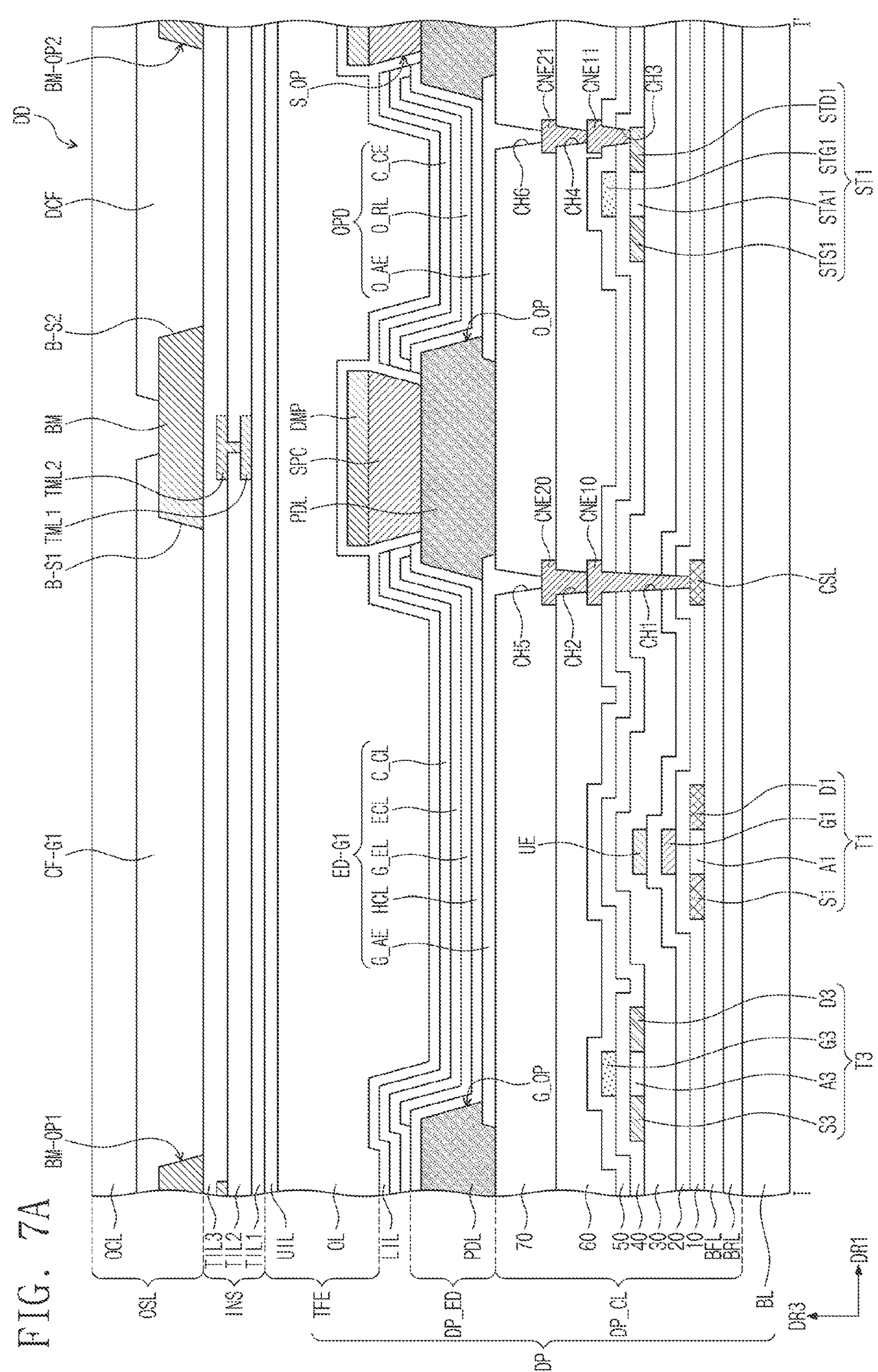
FIG. 7A is a cross-sectional view of the display device cut along line I-I' in FIG. 6.
Figure 7B:
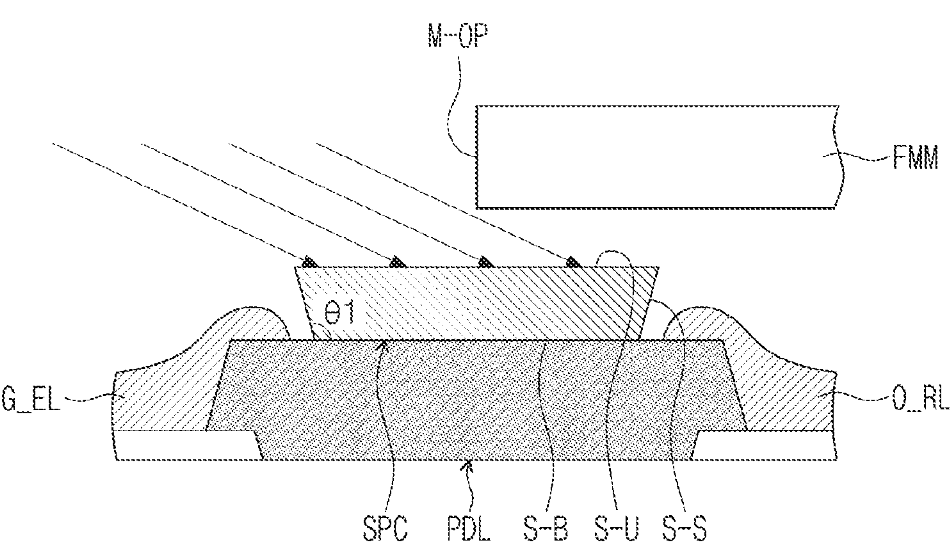
FIG. 7B is an enlarged cross-sectional view of a partial area of a display panel according to an embodiment of the inventive concept.

FIG. 6 is an enlarged plan view of a partial area of a display panel according to an embodiment of the inventive concept. FIG. 7A is a cross-sectional view of the display device cut along line I-I' in FIG. 6. FIG. 7B is an enlarged cross-sectional view of a partial area of a display panel according to an embodiment of the inventive concept. FIG. 6 shows an example arrangement relationship between the light emitting elements ED_G1, ED_G2, ED_B, ED_R and the spacer layer SPC in a plan view.

Figure 7B:
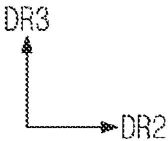

Referring to FIGS. 6 to 7B, the display device DD according to an embodiment may include a display panel DP, an input sensor INS, and a light control layer OSL. The display device DD according to an embodiment may further include a window WM disposed in the light control layer OSL. The window WM may include an optically transparent insulation material. For example, the window WM may include glass or plastic. The front surface of the window WM may define the display surface IS of the display device DD shown in FIG. 1. The display surface IS may include the transmission area TA and the bezel area BZA. The transmission area TA may be an optically transparent area. For example, the transmission area TA may have an area in which the optical transmittance is about 90% or more. The window according to an embodiment may include at least one functional layer including, for example, a finger prevention layer, a hard coating layer, or a reflection prevention layer.

The display panel DP may include a base layer BL, a circuit layer DP_CL, a pixel definition layer PDL, a spacer layer SPC, and an encapsulation layer TFE.

The base layer BL may include a synthetic resin layer. The synthetic resin layer may include a thermosetting resin. For example, the synthetic resin layer may be a polyimide-based resin layer, but the material is not particularly limited. The synthetic resin layer may include, for example, at least one among an acrylic-based resin, a meta-acrylic-based resin, polyisoprene, a vinyl-based resin, an epoxy-based resin, a urethane-based resin, a cellulose-based resin, a siloxane-based resin, a polyamide-based resin, or a parylene-based resin. The base layer BL may include, for example, a glass substrate, a metal substrate, or an organic/inorganic composite material substrate, etc.

At least one inorganic layer is provided on the top surface of the base layer BL. The inorganic layer may include, for example, at least any one among aluminum oxide, titanium oxide, silicon oxide, silicon oxynitride, zirconium oxide, or hafnium oxide. The inorganic layer may be provided with multiple layers. The multiple inorganic layers may constitute a barrier layer BRL and/or a buffer layer BFL to be described below. The barrier layer BRL and the buffer layer BFL may be selectively disposed.

The circuit layer DP_CL may include a barrier layer BRL and/or a buffer layer BFL. The barrier layer BRL may prevent inflow of foreign matter from outside of the display device DD. The barrier layer BRL may include, for example, a silicon oxide layer and a silicon nitride layer. Each of the layers may be provided in plural, and the silicon oxide layers and the silicon nitride layers may be alternately laminated.

The buffer layer BFL may be disposed on the barrier layer BRL. The buffer layer BFL may increase a bonding force between the base layer BL and a semiconductor pattern and/or a conductive pattern. The buffer layer BFL may include, for example, silicon oxide layers and silicon nitride layers. The silicon oxide layers and the silicon nitride layers may be alternately laminated.

The semiconductor pattern may be disposed on the buffer layer BFL. Hereinafter, the semiconductor pattern directly disposed on the buffer layer BFL is defined as a first semiconductor pattern. The first semiconductor pattern may include silicon semiconductor. The first semiconductor pattern may include a polycrystalline semiconductor. However, embodiments of the inventive concept are not limited thereto. For example, in an embodiment, the first semiconductor pattern may include amorphous silicon.

FIG. 7A merely shows a portion of the first semiconductor pattern. The first semiconductor pattern may further be disposed in another area of the pixel. The first semiconductor pattern may have different electrical properties according to whether the pattern is doped. The first semiconductor pattern may include a doped area or an undoped area. The doped area may be doped with an N-type dopant or a P-type dopant. A P-type transistor includes a doped area doped with the P-type dopant, and an N-type transistor includes a doped area doped with the N-type dopant.

The doped area has a larger conductivity than the undoped area, and substantially serves as an electrode or a signal line. The undoped area substantially corresponds to an active area (or a channel unit) of a transistor. In other words, a portion of the first semiconductor pattern may be the active area of the transistor, another portion may be a source or a drain, and another portion may be a connection signal line (or a connection electrode).

As shown in FIG. 7A, the first electrode S1, a channel part A1, and the second electrode D1 of the first transistor T1 are provided from the first semiconductor pattern. The first electrode S1 and the second electrode D1 of the first transistor T1 extend in opposite directions from the channel part A1.

FIG. 7A shows a portion of the signal connection line CSL provided from the semiconductor pattern. According to embodiments, the connection signal line CSL may be connected to the second electrode of the second emission control transistor ET2 (see FIG. 5A) in a plan view.

A first insulation layer 10 is disposed on the base layer BFL. The first insulation layer 10 commonly overlaps the plurality of pixels PX (see FIG. 3), and covers the first semiconductor pattern. The first insulation layer 10 may include, for example, an inorganic material and/or organic material, and have a single layer or multilayer structure. The first insulation layer 10 may include, for example, at least one among aluminum oxide, titanium oxide, silicon oxide, silicon oxynitride, zirconium oxide, or hafnium oxide. In an embodiment, the first insulation layer 10 may be a single silicon oxide layer.

Not only the first insulation layer 10, but also an insulation layer of the circuit layer DP_CL to be described below, may include an inorganic material layer and/or an organic material layer, and have a single layer or multilayer structure. The inorganic layer may include at least one of the foregoing materials.

The third electrode G1 of the first transistor T1 is disposed on the first insulation layer 10. The third electrode G1 may be a portion of a metal pattern. The third electrode G1 of the first transistor T1 may overlap the channel part A1 of the first transistor T1. The third electrode G1 of the first transistor T1 may serve as a mask in a process of doping the first semiconductor pattern.

A second insulation layer 20 covering the third electrode G1 is disposed on the first insulation layer 10. The second insulation layer 20 commonly overlaps the plurality of pixels PX (see FIG. 3). The second insulation layer 20 may include, for example, an inorganic layer and/or organic layer, and have a single layer or multilayer structure. In an embodiment, the second insulation layer 20 may be a single silicon oxide layer.

An upper electrode UE may be disposed on the second insulation layer 20. The upper electrode UE may overlap the third electrode G1. The upper electrode UE may be a portion of a metal pattern or a doped semiconductor pattern. A portion of the third electrode G1 and the upper electrode UE overlapping therewith may define the capacitor Cst (see FIG. 5A). In an embodiment of the inventive concept, the upper electrode UE may be omitted.

In an embodiment of the inventive concept, the second insulation layer 20 may be replaced by an insulation pattern. The upper electrode UE is disposed on the insulation pattern. The upper electrode UE may serve as a mask configured to provide an insulation pattern from the second insulation layer 20.

A third insulation layer 30 covering the upper electrode UE is disposed on the second insulation layer 20. In an embodiment, the third insulation layer 30 may be a single silicon oxide layer.

A semiconductor pattern may be disposed on the third insulation layer 30. Hereinafter, the semiconductor pattern directly disposed on the third insulation layer 30 is defined as a second semiconductor pattern. The second semiconductor pattern may include a metal oxide. The oxide semiconductor may include a crystalline or amorphous oxide semiconductor. For example, the oxide semiconductor may include a metal oxide of zinc(Zn), indium(In), gallium(Ga), tin(Sn), titanium(Ti) or the like, or a mixture material of a metal such as zinc(Zn), indium(In), gallium(Ga), tin(Sn), or titanium(Ti) and an oxide thereof. The oxide semiconductor may include, for example, indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), zinc-tin oxide (ZTO) or the like.

FIG. 7A merely shows a portion of the second semiconductor pattern, and the second semiconductor pattern may be further disposed in another area of the pixel. The second semiconductor pattern may include a plurality of areas divided according to whether the metal oxide is reduced. An area (hereinafter, a reduction area) in which the metal oxide is reduced has a higher conductivity than an area (hereinafter, a non-reduction area) in which the metal oxide is not reduced. The reduction area substantially serves as an electrode or a signal line. The non-reduction area substantially corresponds to the channel part of the transistor. In other words, a portion of the second semiconductor pattern may be the channel part of the transistor, and another portion may be the first or second electrode of the transistor.

As shown in FIG. 7A, a first electrode S3, a channel part A3, and a second electrode D3 of the third transistor T3 may be provided from the second semiconductor pattern. The first electrode S3 and the second electrode D3 may include a metal reduced from a metal-oxide-semiconductor. Each of the first electrode S3 and the second electrode D3 may have a metal layer that has a prescribed thickness from the top surface of the second semiconductor pattern and includes the reduced metal.

A fourth insulation layer 40 covering the second semiconductor pattern is disposed on the third insulation layer 30. In an embodiment, the fourth insulation layer 40 may be a single silicon oxide layer. The third electrode G3 of the third transistor T3 is disposed on the third insulation layer 30. The third electrode G3 may be a portion of a metal pattern. The third electrode G3 of the third transistor T3 may overlap the channel part A3 of the third transistor T3.

In an embodiment of the inventive concept, the fourth insulation layer 40 may be replaced by an insulation pattern. The third electrode G3 of the third transistor T3 may be disposed on the insulation pattern. In an embodiment, the third electrode G3 may have the same shape as the insulation pattern in a plan view. In an embodiment, a single third electrode G3 is shown for convenience of description, but it is to be understood that the third transistor T3 may include two third electrodes.

A fifth insulation layer 50 covering the third electrode G3 is disposed on the fourth insulation layer 40. For example, the fifth insulation layer 50 may include a silicon oxide layer and a silicon nitride layer. The fifth insulation layer 50 may include a plurality of silicon oxide layers and silicon nitride layers alternately laminated.

According to embodiments, the first and second electrodes of the fourth transistor T4 (see FIG T4) may be provided through the same processes as the first electrode S3 and the second electrode D3 of the third transistor T3.

The circuit layer DP_CL may further include a portion of the semiconductor pattern of the sensing driving circuit O_SD (see FIG. 5A). For convenience of explanation, the reset transistor ST1 in the semiconductor pattern of the sensor driving circuit O_SD is shown. A first electrode STS1, a channel part STA1, and a second electrode STD1 of the reset transistor ST1 are provided from a third semiconductor pattern. In an embodiment, the third semiconductor pattern may include the same metal oxide as the second semiconductor pattern of the third transistor T3. The third semiconductor pattern may be provided through the same processes as the second semiconductor pattern. The first electrode STS1 and the second electrode STD1 of the reset transistor ST1 include a metal reduced from the metal oxide semiconductor. Each of the first electrode STS1 and the second electrode STD1 may have a metal layer that has a prescribed thickness from the top surface of the third semiconductor pattern, and that includes the reduced metal.

The fourth insulation layer 40 is disposed to cover the first electrode STS1, the channel part STA1, and the second electrode STD1 of the reset transistor ST1. The third electrode STG1 of the reset transistor ST1 is disposed on the fourth insulation layer 40. In an embodiment, the third electrode STG1 of the reset transistor ST1 may be a portion of the metal pattern. The third electrode STG1 of the reset transistor ST1 may overlap the channel part STA1 of the reset transistor ST1. In an embodiment, a single third electrode STG1 is shown for convenience of description, but the reset transistor ST1 may include two third electrodes.

In an embodiment, the reset transistor ST1 may be disposed on the same layer as the third transistor T3. In other words, the first electrode STS1, the channel part STA1, and the second electrode STD1 of the reset transistor ST1 may be provided through the same processes as the first electrode S3, the channel part A3, and the second electrode D3 of the third transistor T3. According to embodiments, the first and second electrodes of the reset transistor ST2 (see FIG. 5A) and the first and second electrodes of the output transistor ST3 (see FIG. 5A) of the sensor driving circuit O_SD (see FIG. 5A) may be provided through the same processes as the first and second electrodes S1, D1 of the first transistor T1. In this way, the sensor driving circuit O_SD (see FIG. 5A) may be concurrently provided through processes of providing the pixel driving circuits R_PD, G1_PD, G2_PD, B_PD (see FIG. 4A), and thus, in embodiments, additional processes for providing the sensor driving circuit O_SD (see FIG. 5A) are not utilized, which may improve the process efficiency.

At least one insulation layer is further disposed on the fifth insulation layer 50. In an embodiment, a sixth insulation layer 60 and a seventh insulation layer 70 may be disposed on the fifth insulation layer 50. Each of the sixth insulation layer 60 and the seventh insulation layer 70 may be an organic layer and have a single layer or multilayer structure. Each of the sixth and seventh insulation layers 60 and 70 may be a single polyimide-based resin layer. Embodiments of the inventive concept are not limited thereto, and each of the sixth and seventh insulation layers 60 and 70 may include, for example, at least one among an acrylic-based resin, a meta-acrylic-based resin, polyisoprene, a vinyl-based resin, an epoxy-based resin, a urethane-based resin, a cellulose-based resin, a siloxane-based resin, a polyamide-based resin, and a parylene-based resin.

A first connection electrode CNE10 may be disposed on the fifth insulation layer 50. The first connection electrode CNE10 may be connected to the connection signal line CSL through a first contact hole CH1 penetrating through the first to fifth insulation layers 10 to 50, and a second connection electrode CNE20 may be connected to the first connection electrode CNE10 through a second contact hole CH2 penetrating through the sixth insulation layer 60. In an embodiment of the inventive concept, at least one of the fifth insulation layer 50 to the seventh insulation layer 70 may be omitted.

A third connection electrode CNE11 may further be disposed on the fifth insulation layer 50. The third connection electrode CNE11 may be connected to the second electrode STD1 of the reset transistor ST1 through a third contact hole CH3 penetrating through the fourth and fifth insulation layers 40 and 50, and a fourth connection electrode CNE21 may be connected to the third connection electrode CNE11 through a fourth contact hole CH4 penetrating through the sixth insulation layer 60.

The element layer DP_ED is disposed on the circuit layer DP_CL. The element layer DP_ED may include the first green anode electrode O_AE and the sensing anode electrode O_AE. As shown in FIG. 7A, the first green anode electrode O_AE may be connected to the second connection electrode CNE20 through a fifth contact hole CH5 penetrating the seventh insulation layer 70. The sensing anode electrode O_AE may be connected to the fourth connection electrode CNE21 through a sixth contact hole CH6 penetrating through the seventh insulation layer 70.

The element layer DP_ED may include the pixel definition layer PDL disposed on the circuit layer DP_CL. The pixel definition layer PDL may include light emitting openings defined in correspondence to the light emitting elements ED_R, ED_G1, ED_G2, ED_B, and light receiving openings defined in correspondence to the light receiving elements OPD. Each of the light emitting openings exposes at least a portion of the anode electrode included in the corresponding light emitting element, and each of the light receiving openings exposes at least a portion of the sensing anode electrode included in the corresponding light receiving element. FIG. 7A shows an example green light emitting opening G_OP corresponding to the first green light emitting element ED-G1 and an example light receiving opening O_OP corresponding to one light receiving element OPD. The pixel definition layer PDL according to an embodiment may include a black color.

At least the portion of the anode electrode exposed from the pixel definition layer PDL by each of the light emitting openings may be defined as a light emitting area in which light is provided. For example, the plurality of pixels PX (see FIG. 3) may be disposed on a plane of the display panel DP in a certain rule. The area in which the plurality of pixels PX (see FIG. 3) are disposed may be defined as a pixel area, and one pixel area may include the light emitting area and a non-light emitting area adjacent to the light emitting area. The non-light emitting area may surround the light emitting area.

Each of the light receiving openings exposes the sensing anode electrode O_AE of the corresponding light receiving element OPD. Each of the light receiving openings of the pixel definition layer PDL may define a light receiving area. For example, the plurality of sensors FX (see FIG. 3) may be disposed on the plane of the display panel DP in a certain rule. The area in which the plurality of sensors FX (see FIG. 3) are disposed may be defined as a sensing area, and one sensing area may include the light receiving area and a non-light receiving area adjacent to the light receiving area. The non-light receiving area may surround the light receiving area.

The spacer layer SPC may be disposed on the pixel definition layer PDL adjacent to the light receiving element OPD. In one direction, the width of the spacer layer SPC may be smaller than that of the pixel definition layer PDL. Accordingly, a portion of the top surface of the pixel definition layer PDL may be exposed from the spacer layer SPC. According to an embodiment, the thickness of the spacer layer SPC in the third direction DR3 may be smaller than that of the pixel definition layer PDL.

According to an embodiment, the spacer layer SPC may have an integral shape with the pixel definition layer PDL. In other words, the spacer layer SPC may be concurrently provided through patterning processes for providing the light emitting openings and the light receiving openings in the pixel definition layer PDL. However, embodiments are not limited thereto, and the spacer layer SPC may be provided in separate processes from the pixel definition layer PDL, and here, the spacer layer SPC and the pixel definition layer PDL may include different materials from each other.

The spacer layer SPC may have an inverse taper shape in a cross section. Accordingly, a common layer commonly included (or commonly formed) in the light emitting elements ED_R, ED_G1, ED_G2, ED_B and the light receiving elements OPD through the open mask may be partially disconnected on the basis of the spacer layer SPC. Descriptions thereof will be provided below. The commonly formed common layer does not overlap the spacer layer SPC.

Referring to FIGS. 6 and 7A, each of the spacer layers SPC may be disposed between the adjacent light emitting elements ED_R, ED_G1, ED_G2, ED_B in the first direction DR1 and the second direction DR2, and surround at least a portion of the light receiving element OPD disposed between the light emitting elements ED_R, ED_G1, ED_G2, ED_B.

Each of the spacer layers SPC may include a spacer opening S_OP and a bridge groove BH connected to the spacer opening S_OP. The spacer opening S_OP may overlap the corresponding light receiving opening O_OP. The bridge groove BH may expose a portion of the top surface of the pixel definition layer PDL on which the spacer layer SPC is disposed. FIG. 6 illustrates that the bridge groove BF included in each of the spacer layer SPC extends in the second direction DR2, but embodiments are not limited thereto. The direction in which the bridge groove BH extends is not limited to any one direction, unless the direction is a direction towards which the first and second green light emitting elements ED_G1, ED_G2 face.

According to an embodiment, a second separation distance TH2 between the blue light emitting element ED_B and the spacer layer SPC in the second direction DR2, a first separation distance TH1 between the red light emitting element ED_R and the spacer layer SPC in the second direction DR2, a third separation distance TH3 between the first green light emitting element ED_G1 and the spacer layer SPC in the first direction DR1, and a fourth separation distance TH4 between the second green light emitting element ED_G2 and the spacer layer SPC in the first direction DR1 may be the same.

According to an embodiment, a first width W-S of the spacer layer SPC in the first direction DR1 and the second direction DR2 may be about 12 μm to about 18 μm. In a case in which the width of the spacer layer SPC is smaller than about 12 μm, when the common layer is included in (formed in) the light emitting elements ED_R, ED_G1, ED_G2, ED_B and the light receiving elements OPD, the common layer is not disconnected according to embodiments. When a second width of the spacer layer is larger than about 18 μm, the separation distance between the light emitting elements ED_R, ED_G1, ED_G2, ED_B increases, which may lower the display quality.

Among the light emitting elements, a third width W-E from one surface that is most adjacent to the spacer layer SPC to one surface of the spacer layer SPC adjacent to the light receiving element OPD may be defined as the sum of the first separation distance and the first width W-S.

The width W-B between side surfaces of the spacer layer SPC defining the bridge groove BH in the spacer layer SPC may be about 3.5 μm to about 5 μm.

Referring to FIG. 7A, a hole control layer HCL may be disposed on the first green anode electrode G1_AE exposed by the green light emitting opening G_OP. In addition, the hole control layer HCL may be disposed on the sensing anode electrode O_AE exposed by the light receiving opening O_OP.

The first green light emitting layer G_EL may be disposed on the hole control layer HCL in an area overlapping the green light emitting opening G_OP. A photoelectric conversion layer O_RL may be disposed on the hole control layer HCL in an area overlapping the light receiving opening O_OP.

An electron control layer ECL may be disposed on the first green light emitting layer G_EL in an area overlapping the green light emitting opening G_OP. In addition, the electron control layer ECL may be disposed on the photoelectric conversion layer O_RL in an area overlapping the light receiving opening O_OP.

The cathode electrode C_CE is disposed on the electron control layer ECL in an area overlapping the green light emitting opening G_OP. In addition, the cathode electrode C_CE may be disposed on the electron control layer ECL in an area overlapping the light receiving opening O_OP.

According to an embodiment of the inventive concept, the hole control layer HCL, the electron control layer ECL, and the cathode electrode C_CE may be deposited by means of the open mask to be defined as the common layer commonly provided to the light emitting elements ED_R, ED_G1, ED_G2, ED_B, and the light receiving elements OPD.

According to an embodiment of the inventive concept, the common layer included in (formed in) the light emitting elements ED_R, ED_G1, ED_G2, ED_B and the light receiving elements OPD may be partially disconnected by the spacer layer SPC. In other words, a portion disposed in the spacer opening S_OP in the common layer may be connected to the common layer disposed in an adjacent area through the bridge groove BH, and a portion overlapping the spacer layer SPC in the common layer may be disconnected from the portion disposed in the spacer opening S_OP. Accordingly, in an embodiment, the common layer included in (formed in) the light emitting elements ED_R, ED_G1, ED_G2, ED_B and the light receiving elements OPD does not overlap the spacer layer SPC. The spacer layer SPC according to an embodiment of the inventive concept may have an inverse taper shape to disconnect the common layer more efficiently.

According to an embodiment of the inventive concept, the first and second green light emitting elements ED_G1, ED_G2, which provide green color light, among the light emitting elements ED_R, ED_G1, ED_G2, ED_B, and the light receiving element OPD are partially disconnected through the spacer layer SPC, and thus, when the first and second green light emitting elements ED_G1, ED_G2 emit the light, a path of a leakage current transferred to the light receiving element OPD through the hold control layer HCL may extend. Accordingly, a phenomenon that the current accumulated in the first and second green light emitting elements ED_G1, ED_G2 leaks to the light receiving element OPD through the hole control layer HCL may be reduced (or minimized). Thus, the display device DD including the sensors FX (see FIG. 3) with increased sensing performance may be provided by blocking or reducing (or minimizing) the path along which the leakage current flows to the light receiving element OPD.

In addition, in an embodiment, a separate power supply that drives the light receiving element OPD is not implemented, and power wirings (e.g. the second driving voltage line VL2) that drive the light emitting elements R_ED, G1_ED, G2_ED, B_ED may be shared together. According to an embodiment of the inventive concept, even when the power wirings are shared, the common layer is partially disconnected through the spacer layer SPC to block the current leakage, and thus, the potential of the first sensing node SN1 (see FIG. 5A) may be stably maintained and the sensing performance of the sensor FX (see FIG. 3) may be increased. Accordingly, the display device DD with increased sensing performance may be provided.

Referring to FIG. 7A again, a dummy pattern DMP may be disposed on the spacer layer SPC. The dummy pattern DMP may include the same material as at least one of the layers included in the common layer. In other words, the dummy pattern may be a portion disconnected by the spacer layer SPC in a process of providing the common layer commonly included in the light emitting elements ED_R, ED_G1, ED_G2, ED_B and the light receiving elements OPD.

The encapsulation layer TFE may include a plurality of inorganic layers LIL, UIL and at least one organic layer OL disposed between the inorganic layers LIL, UIL. The first inorganic layer LIL may be disposed on the cathode electrode C_CE. The organic layer OL and the second inorganic layer UIL may be sequentially disposed on the first inorganic layer LIL.

The first and second inorganic layers LIL, UIL may protect the light emitting elements from moisture and/or oxygen. The first and second inorganic layers LIL, UIL may include, for example, at least one among aluminum oxide, titanium oxide, silicon oxide, silicon nitride, silicon oxynitride, zirconium oxide, or hafnium oxide. However, the material of the first and second inorganic layers LIL, UIL is not limited thereto.

The inorganic layer OL may protect the light emitting elements from foreign matter such as dust particles. For example, the organic layer OL may include an acrylic-based resin. However, the material of the organic layer OL is not limited thereto.

The display device DD according to an embodiment may include an input sensor INS. The input sensor INS may be disposed on the display panel DP. The input sensor INS may include at least one conductive layer and at least one insulation layer. In an embodiment, the input sensor INS may include a first sensing insulation layer TIL1, a first conductive layer TML1, a second sensing insulation layer TIL2, a second conductive layer TML2, and a third sensing insulation layer TIL3.

The first sensing insulation layer TIL1 may be directly disposed on the second inorganic layer UIL. The first conductive layer TML1 is disposed on the first sensing insulation layer TIL1. The second sensing insulation layer TIL2 covers the first conductive layer TML1 and is disposed on the first sensing insulation layer TIL1. The second conductive layer TML2 is disposed on the second sensing insulation layer TIL2. The third sensing insulation layer TIL3 covers the second conductive layer TML2 and is disposed on the second sensing insulation layer TIL3. The first conductive layer TML1 and the second conductive layer TML2 may overlap the pixel definition layer PDL.

Each of the first to third sensing insulation layers TIL1, TIL2, TIL3 may be an inorganic layer including, for example, any one among silicon nitride, silicon oxynitride, or silicon oxide.

Each of the first conductive layer TML1 and the second conductive layer TML2 may have a single layer structure, or a multilayer structure in which multiple layers are laminated along the third direction DR3. The second conductive layer TML2 may include conductive lines configured to define a mesh-shaped electrode. At least one of the conductive pattern of the first conductive layer TML1 and the conductive pattern of the second conductive layer TML2 may be connected through a contact hole penetrating through the second sensing insulation layer TIL2.

Each of the first conductive layer TML1 and the second conductive layer TML2 of the single layer structure may include a metal layer or a transparent conductive layer. The metal layer may include, for example, molybdenum, silver, titanium, copper, aluminum, or an alloy thereof. The transparent conductive layer may include transparent conductive oxide such as, for example, indium tin oxide, indium zinc oxide, zinc oxide, or indium-zinc-tin oxide. The transparent conductive layer may include a conductive polymer such as, for example, PEDOT, a metal nano-wire, or graphene.

Each of the first conductive layer TML1 and the second conductive layer TML2 of the multilayer structure may include metal layers. For example, the layers may have a three-layer structure of titanium/aluminum/titanium. The conductive layer of a multilayer structure may include at least one metal layer and at least one transparent conductive layer. The second sensing insulation layer TIL2 may be disposed between the first conductive layer TML1 and the second conductive layer TML2.

The optical control layer OSL may be disposed on the input sensor INS. The optical control layer OSL may include a light blocking layer overlapping the pixel definition layer PDL and including light blocking openings BM-OP1, BM-OP2, color filters CF_G1, DCF disposed in the corresponding light blocking openings BM-OP1, BM-OP2, and an over-coating layer OCL. Even though FIG. 7A shows an example green color filter CF_G1 overlapping the first green light emitting element ED_G1, the light control layer OSL may further include color filters overlapping the second green light emitting element ED_G2, the blue light emitting element ED_B, and the red light emitting element ED_R.

The light blocking layer ML may absorb external light incident from outside of the display device DD to prevent the external light from being reflected to the first and the second conductive layers TML1, TML2. The first light blocking opening BM-OP1 may overlap the green light emitting opening G_OP, and the second light blocking opening BL-OP2 may overlap the light receiving opening O-OP.

According to an embodiment, a first side B-S1, configured to define the first blocking opening BM-OP1, of the light blocking layer BM may be more adjacent to the center of the pixel definition layer PDL than a second side B-S2, configured to define the second light blocking opening unit BM-OP2, of the light blocking layer BM. Accordingly, the light extraction efficiency of the light emitting elements ED_R, ED_G1, ED_G2, ED_B may be increased.

A green color filter CF-G1 overlapping the first green light emitting element ED_G1 may have a green color. In addition, a color filter overlapping the second green light emitting element ED_G2 may have a green color, a color filter overlapping the blue light emitting element ED_B may have a blue color, and a color filter overlapping the red light emitting element ED_R may have a red color. As the display device DD includes the color filters, the light incident from outside of the display device DD may be filtered to reduce a reflection ratio of the external light.

According to an embodiment, the light control layer OSL may further include a dummy color filter DCF overlapping the light receiving opening O_OP. The dummy color filter DCF may have any one of the green, red, or blue color. However, embodiments are not limited thereto, and the dummy color filter DCF may be omitted according to embodiments.

Referring to FIG. 7B, the spacer layer SPC may include a bottom surface S-B contacting the pixel definition layer PDL, a top surface S-U facing the bottom surface S-B, and side surfaces S-S connecting the bottom surface S-B and the top surface S-U.

According to an embodiment, a first angle Q1 between the bottom surface S-B and the side surface S-S may be an obtuse angle. Accordingly, an angle between the top surface S-U and the side surface S-S may be an acute angle. As the spacer layer SPC according to an embodiment of the inventive concept has the inverse taper shape, the common layer may be more efficiently disconnected.

The green light emitting layer G_EL may be provided through a deposition process using a mask FMM having a deposition opening M-OP provided therein. Arrows in FIG. 7B show an example direction in which a deposition material is input in a process of providing the green light emitting layer G_EL.

According to an embodiment, as the spacer SPC of the inverse taper shape is included, the deposition material providing the green light emitting layer G_EL is prevented from being deposited on an area on which the photoelectric conversion layer O_RL is to be provided.

According to an embodiment, as an interval between the light emitting elements ED_R, ED_G1, ED_G2, ED_B (see FIG. 4A) is reduced in a high resolution product, even when the width of the pixel definition layer PDL decreases to reduce a deposition margin for providing the light emitting layer, the spacer layer SPC of the inverse taper shape may increase a deposition rate of the light emitting layers adjacent to the spacer layer SPC. Accordingly, the display device DD with increased display quality may be provided.

Figure 8:
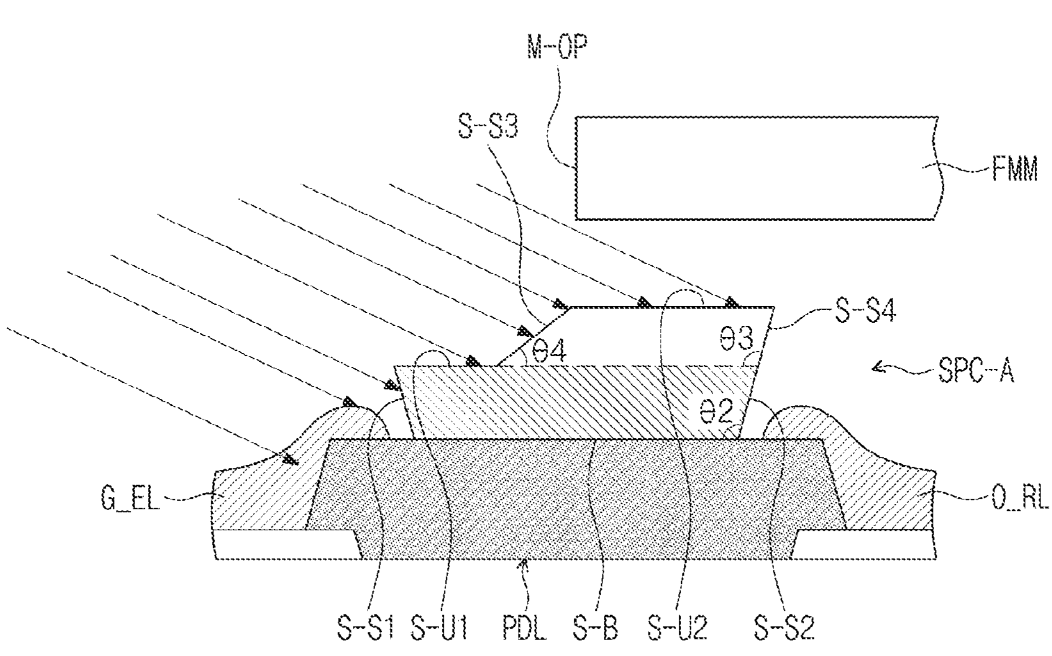
FIG. 8 is an enlarged cross-sectional view of a partial area of a display panel according to an embodiment of the inventive concept.
Figure 8:
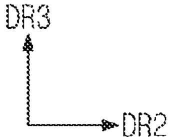

Referring to FIG. 8, a spacer layer SPC-A according to an embodiment may include a first part disposed on the pixel definition layer PDL and a second part disposed on the first part. The second part may expose a portion of the first part adjacent to the green light emitting layer G_EL. The first part and the second part are a substantially integral component, but for convenience of explanation, the first part and the second part will be separately described. The first part and second part may be provided by means of a slit mask or through halftone processes.

The first part may include a bottom surface S-B contacting the pixel definition layer PDL, a first top surface S-U1 facing the bottom surface S-B and exposed from the second part, a first side surface S-S1 connecting the bottom surface S-B and the first top surface S-U1, and a second side surface S-S2 facing the first side surface S-S1 and adjacent to the photoelectric conversion layer O_RL.

The second part may include a second top surface S-U2 facing the bottom surface S-B, a third side surface S-S3 connecting the first top surface S-U1 and the second top surface S-U2, and a fourth side surface S-S2 facing the third side surface S-S3.

According to an embodiment, an angle between the bottom surface S-B and the first side surface S-S1 and a second angle θ2 between the bottom surface S-B and the second side surface S-S2 may be obtuse angles. A third angle @3 between the fourth side surface S-S4 and an extension line (a dotted line) of the first top surface S-U1 may be an obtuse angle. According to an embodiment, the fourth side surface S-S4 may be aligned with the second side surface S-S2. Accordingly, the second angle θ2 and the third angle θ3 may be the same. A fourth angle θ4 between the third side surface S-S3 and the extension line (the dotted line) of the first top surface S-U1 may be an acute angle.

As an embodiment according to FIG. 8 includes a two-stage spacer layer SPC-A, the deposition material providing the green light emitting layer G_EL is prevented from being deposited on an area on which the photoelectric conversion layer O_RL is to be provided.

According to an embodiment, as an interval between the light emitting elements ED_R, ED_G1, ED_G2, ED_B (see FIG. 4A) is reduced in a high resolution product, even when the width of the pixel definition layer PDL decreases to reduce a deposition margin for providing the light emitting layer, the two-stage spacer layer SPC-A may increase a deposition rate of the light emitting layers adjacent to the spacer layer SPC-A. Accordingly, a display device DD with increased display quality may be provided.

Figure 9:
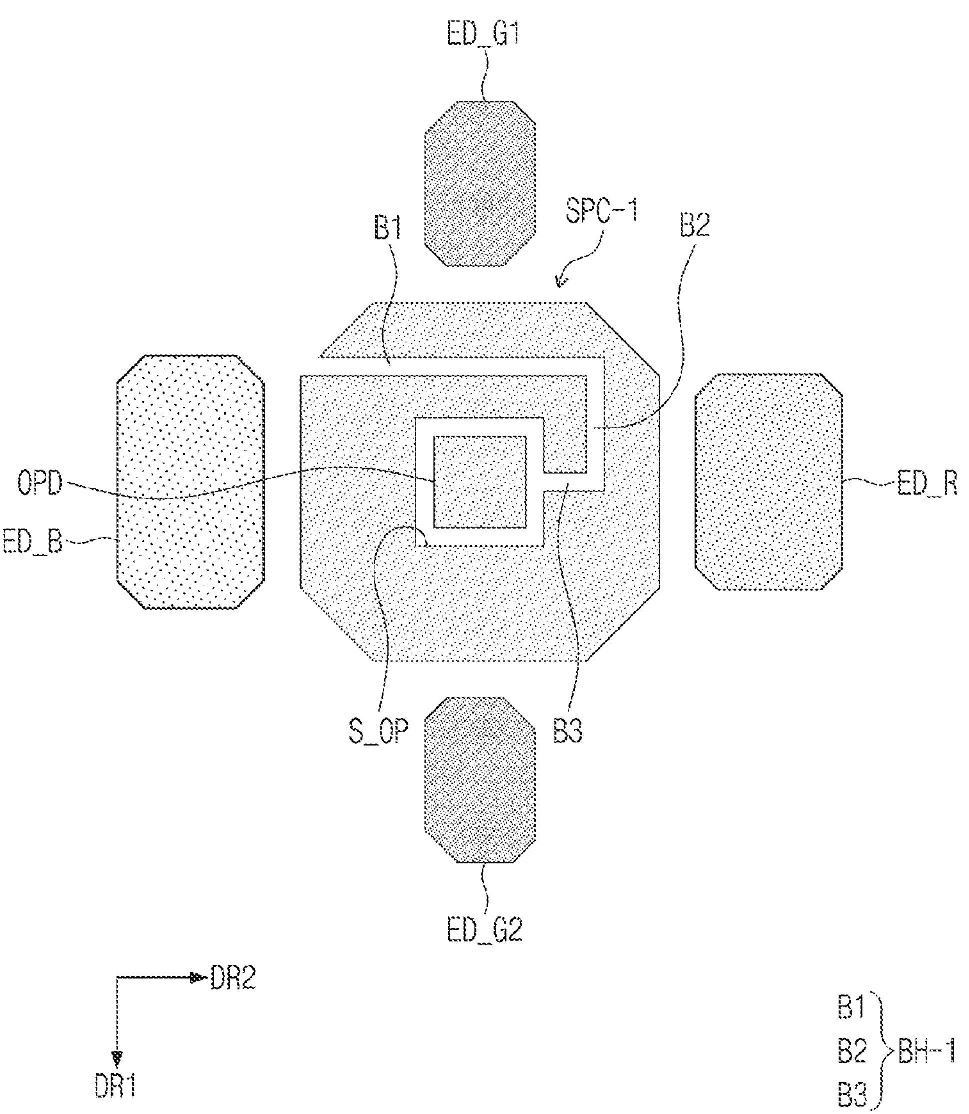
FIG. 9 is a plan view showing an arrangement relationship between light emitting elements and a spacer layer according to an embodiment of the inventive concept.
Figure 10:
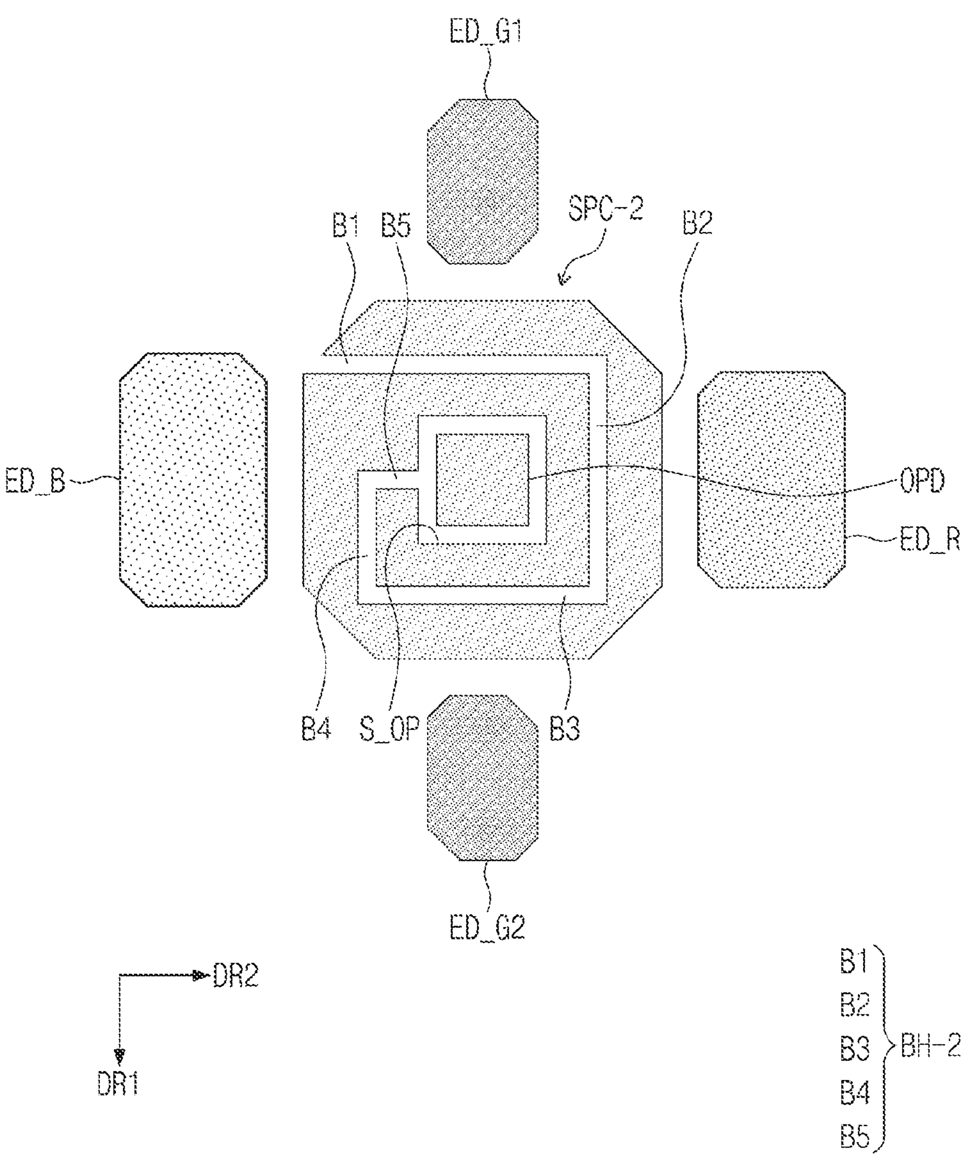
FIG. 10 is a plan view showing an arrangement relationship between light emitting elements and a spacer layer according to an embodiment of the inventive concept.
Figure 11:
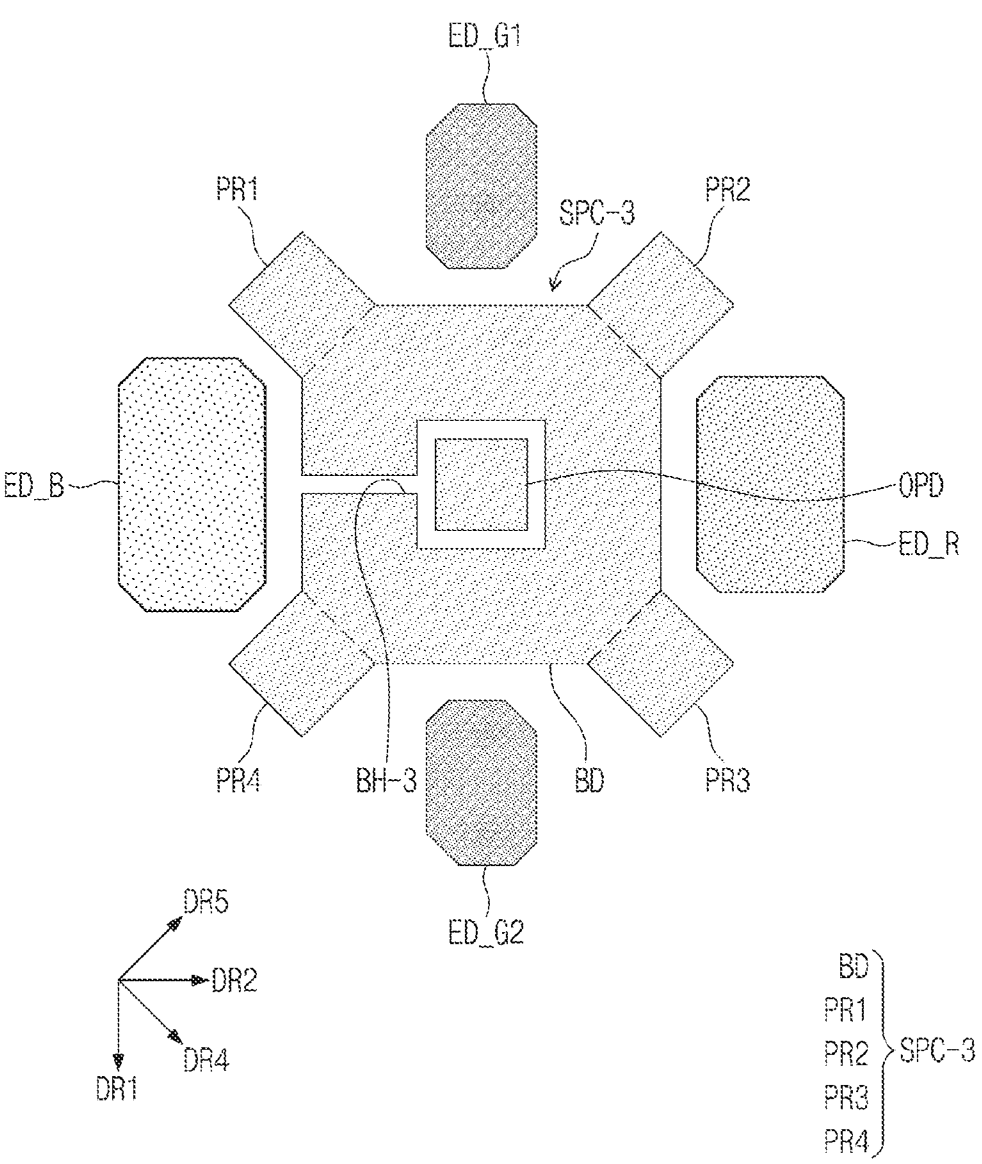
FIG. 11 is a plan view showing an arrangement relationship between light emitting elements and a spacer layer according to an embodiment of the inventive concept.
Figure 12:
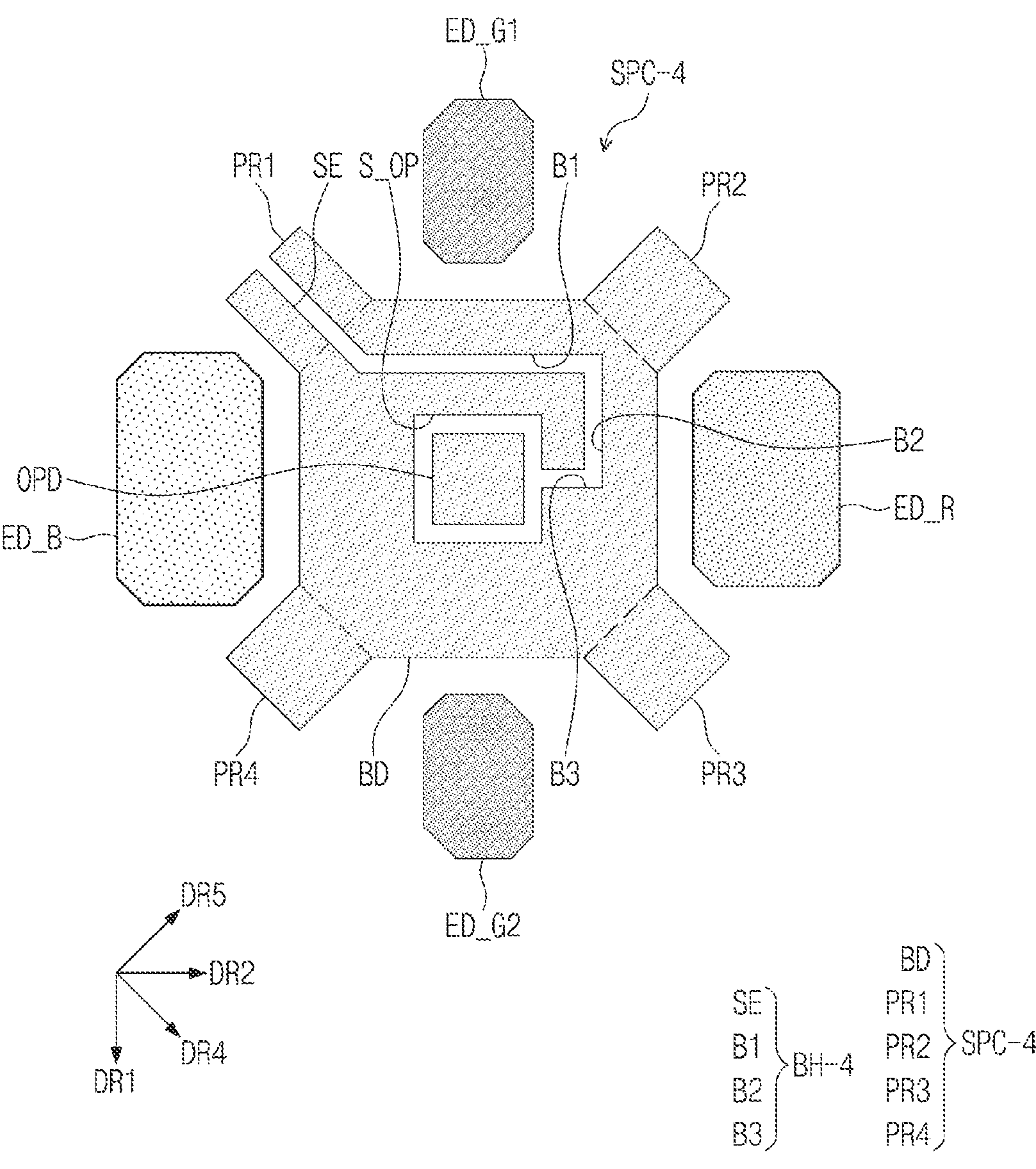
FIG. 12 is a plan view showing an arrangement relationship between light emitting elements and a spacer layer according to an embodiment of the inventive concept.
Figure 13:
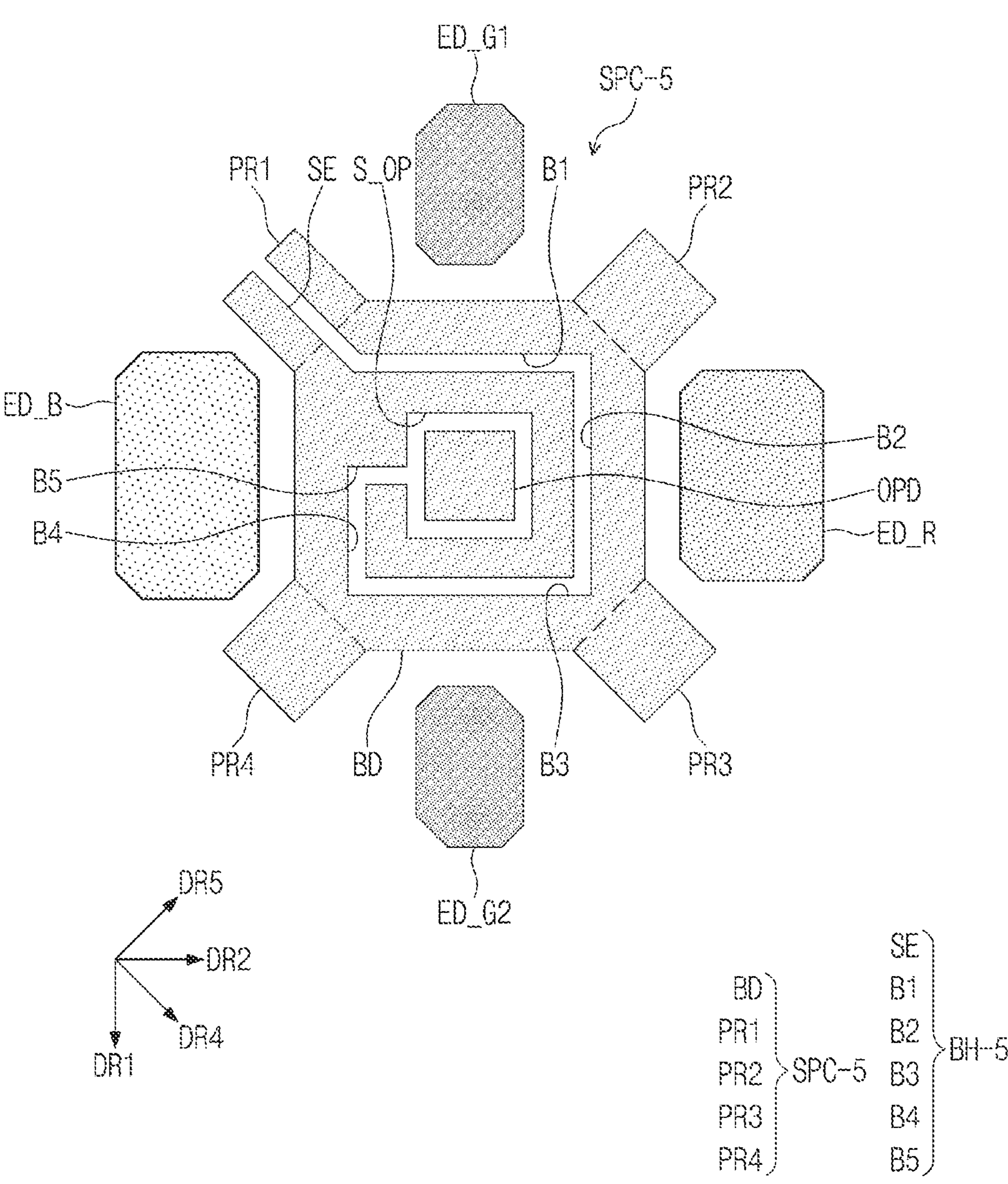
FIG. 13 is a plan view showing an arrangement relationship between light emitting elements and a spacer layer according to an embodiment of the inventive concept.

FIG. 9 is a plan view showing an arrangement relationship between light emitting elements and a spacer layer according to an embodiment of the inventive concept. FIG. 10 is a plan view showing an arrangement relationship between light emitting elements and a spacer layer according to an embodiment of the inventive concept. FIG. 11 is a plan view showing an arrangement relationship between light emitting elements and a spacer layer according to an embodiment of the inventive concept. FIG. 12 is a plan view showing an arrangement relationship between light emitting elements and a spacer layer according to an embodiment of the inventive concept. FIG. 13 is a plan view showing an arrangement relationship between light emitting elements and a spacer layer according to an embodiment of the inventive concept. For the same/similar components as in FIGS. 4A to 7B, the same/similar reference numerals are used and their repetitive descriptions will be omitted.

Referring to FIG. 9, a spacer layer SPC-1 according to an embodiment may be disposed between the adjacent light emitting elements ED_R, ED_G1, ED_G2, ED_B in the first direction DR1 and the second direction DR2, and surround at least the portion of the light receiving element OPD disposed between the light emitting elements ED_R, ED_G1, ED_G2, ED_B.

The spacer layer SPC-1 may include a spacer opening S_OP and a bridge groove BH-1 connected to the spacer opening S_OP. The spacer opening S_OP may overlap the corresponding light receiving opening O_OP (see FIG. 7A). The bridge groove BH-1 may expose a portion of the top surface of the pixel definition layer PDL (see FIG. 7A) on which the spacer layer SPC-1 is disposed. The spacer opening S_OP may overlap the light receiving opening O_OP included in the pixel definition layer PDL (see FIG. 7A), and the bridge groove BH-1 may expose the top surface of the pixel definition layer PDL (see FIG. 7A) on which the spacer layer SPC-1 is disposed. The common layer may be partially disconnected by the spacer layer SPC-1, and a common layer disposed in the spacer opening S_OP may be connected to the common layer disposed outside of the spacer layer SPC-1 through the bridge groove BH-1.

The bridge groove BH-1 according an embodiment may include a first groove B1, a second groove B2, and a third groove B3.

The first groove B1 may be disposed between the light receiving element OPD and the first green light emitting element ED_G1, and extend in the second direction DR2. The second groove B2 may be connected to the first groove B1, and disposed between the light receiving element OPD and the red light emitting element ED_R to extend in the first direction DR1. The third groove B3 may be connected to the second groove B2 and the spacer opening S_OP to extend in the second direction DR2.

Referring to FIG. 10, a spacer layer SPC-2 according to an embodiment may be disposed between the adjacent light emitting elements ED_R, ED_G1, ED_G2, ED_B in the first direction DR1 and the second direction DR2, and surround at least a portion of the light receiving element OPD disposed between the light emitting elements ED_R, ED_G1, ED_G2, ED_B.

The spacer layer SPC-2 may include a spacer opening S_OP and a bridge groove BH-2 connected to the spacer opening S_OP. The spacer opening S_OP may overlap the corresponding light receiving opening O_OP (see FIG. 7A). The bridge groove BH-2 may expose a portion of the top surface of the pixel definition layer PDL (see FIG. 7A) on which the spacer layer SPC-2 is disposed.

The common layer may be partially disconnected by the spacer layer SPC-2, and a common layer disposed in the spacer opening S_OP may be connected to the common layer disposed outside of the spacer layer SPC-2 through the bridge groove BH-2.

The bridge groove BH-2 according an embodiment may include a first groove B1, a second groove B2, a third groove B3, a fourth groove B4, and a fifth groove B5.

The first groove B1 may be disposed between the light receiving element OPD and the first green light emitting element ED_G1, and extend in the second direction DR2. The second groove B2 may be connected to the first groove B1, and disposed between the light receiving element OPD and the red light emitting element ED_R to extend in the first direction DR1. The third groove B3 may be connected to the second groove B2, and disposed between the light receiving element OPD and the second green light emitting element ED_G2 to extend in the second direction DR2. The fourth groove B4 may be connected to the third groove B3, and disposed between the light receiving element OPD and the blue light emitting element ED_B to extend in the first direction DR1. The fifth groove B5 may be connected to the fourth groove B4 and the spacer opening S_OP to extend in the second direction DR2.

Referring to FIG. 11, a spacer layer SPC-3 according to an embodiment may be disposed between the adjacent light emitting elements ED_R, ED_G1, ED_G2, ED_B in the first direction DR1 and the second direction DR2, and surround at least the portion of the light receiving element OPD disposed between the light emitting elements ED_R, ED_G1, ED_G2, ED_B.

The spacer layer SPC-3 may include a body BD including a spacer opening S_OP and the bridge groove BH-3 connected to the spacer opening S_OP, and protruding units PR1, PR2, PR3, PR4 protruding from the body BD. The body BD and the protruding units PR1, PR2, PR3, PR4 are a substantially integral component, but, for convenience of explanation, will be separately described.

The spacer opening S_OP may overlap the corresponding light receiving opening O_OP (see FIG. 7A). The bridge groove BH-3 may expose a portion of the top surface of the pixel definition layer PDL (see FIG. 7A) on which the body BD is disposed. The common layer may be partially disconnected by the spacer layer SPC-3, and a common layer disposed in the spacer opening S_OP may be connected to the common layer disposed outside of the spacer layer SPC-3 through the bridge groove BH-3.

The first and third protruding units PR1, PR3 may protrude in the fourth direction DR4 from the corresponding body BD, and the second and fourth protruding units PR2, PR4 may protrude in the fifth direction DR5 from the corresponding body BD.

Accordingly, each of the first and third protruding units PR1, PR3 may be disposed between the adjacent light emitting areas in the fifth direction DR5, and each of the second and fourth protruding units PR2, PR4 may be disposed between the adjacent light emitting areas in the fourth direction.

The bridge groove BH-3 according to an embodiment may be connected to the spacer opening S_OP, and disposed between the light receiving element OPD and the blue light emitting element ED_B to extend in the second direction DR2.

Referring to FIG. 12, a spacer layer SPC-4 according to an embodiment may be disposed between the adjacent light emitting elements ED_R, ED_G1, ED_G2, ED_B in the first direction DR1 and the second direction DR2, and surround at least the portion of the light receiving element OPD disposed between the light emitting elements ED_R, ED_G1, ED_G2, ED_B.

The spacer layer SPC-4 may include a body BD including a spacer opening S_OP and a portion of the bridge groove BH-4 connected to the spacer opening S_OP, and protruding units PR1, PR2, PR3, PR4 protruding from the body BD and including the other portion of the bridge groove BH-4. The body BD and the protruding units PR1, PR2, PR3, PR4 are a substantially integral component, but, for convenience of explanation, will be separately described.

The spacer opening S_OP may overlap the corresponding light receiving opening O_OP (see FIG. 7A). The bridge groove BH-4 may expose a portion of the top surface of the pixel definition layer PDL (see FIG. 7A) on which the body BD is disposed. The common layer may be partially disconnected by the spacer layer SPC-4, and a common layer disposed in the spacer opening S_OP may be connected to the common layer disposed outside of the spacer layer SPC-4 through the bridge groove BH-4.

The first and third protruding units PR1, PR3 may protrude in the fourth direction DR4 from the corresponding body BD, and the second and fourth protruding units PR2, PR4 may protrude in the fifth direction DR5 from the corresponding body BD.

Accordingly, each of the first and third protruding units PR1, PR3 may be disposed between the adjacent light emitting areas in the fifth direction, and each of the second and fourth protruding units PR2, PR4 may be disposed between the adjacent light emitting areas in the fourth direction.

The bridge groove BH-4 according an embodiment may include a diagonal groove SE, a first groove B1, a second groove B2, and a third groove B3.

The diagonal groove SE may be included in the first protruding unit PR1. The first protruding unit PR1 may be disposed between the light emitting elements ED_G1, ED_B spaced apart along the fifth direction DR5. The diagonal groove SE may extend along the fourth direction DR4. The first groove B1 may be connected to the diagonal groove SE, and disposed between the light receiving element OPD and the first green light emitting element ED_G1 to extend in the second direction DR2. The second groove B2 may be connected to the first groove B1, and disposed between the light receiving element OPD and the red light emitting element ED_R to extend in the first direction DR1. The third groove B3 may be connected to the second groove B2 and the spacer opening S_OP to extend in the second direction DR2.

Referring to FIG. 13, a spacer layer SPC-5 according to an embodiment may be disposed between the adjacent light emitting elements ED_R, ED_G1, ED_G2, ED_B in the first direction DR1 and the second direction DR2, and surround at least the portion of the light receiving element OPD disposed between the light emitting elements ED_R, ED_G1, ED_G2, ED_B.

The spacer layer SPC-5 may include a body including a spacer opening S_OP and a portion of the bridge groove BH-5 connected to the spacer opening S_OP, and protruding units PR1, PR2, PR3, PR4 protruding from the body BD and including the other portion of the bridge groove BH-5. The body BD and the protruding units PR1, PR2, PR3, PR4 are a substantially integral component, but, for convenience of explanation, will be separately described.

The spacer opening S_OP may overlap the corresponding light receiving opening O_OP (see FIG. 7A). The bridge groove BH-5 may expose a portion of the top surface of the pixel definition layer PDL (see FIG. 7A) on which the body BD is disposed. The common layer may be partially disconnected by the spacer layer SPC-5, and a common layer disposed in the spacer opening S_OP may be connected to the common layer disposed outside of the spacer layer SPC-5 through the bridge groove BH-5.

The first and third protruding units PR1, PR3 may protrude in the fourth direction DR4 from the corresponding body BD, and the second and fourth protruding units PR2, PR4 may protrude in the fifth direction DR5 from the corresponding body BD.

Accordingly, each of the first and third protruding units PR1, PR3 may be disposed between the adjacent light emitting areas in the fifth direction, and each of the second and fourth protruding units PR2, PR4 may be disposed between the adjacent light emitting areas in the fourth direction.

The bridge groove BH-5 according an embodiment may include a diagonal groove SE, a first groove B1, a second groove B2, a third groove B3, a fourth groove B4, and a fifth groove B5.

The diagonal groove SE may be included in the first protruding unit PR1. The first protruding unit PR1 may be disposed between the light emitting elements ED_G1, ED_B spaced apart along the fifth direction DR5. The diagonal groove SE may extend along the fourth direction DR4. The first groove B1 may be connected to the diagonal groove SE, and disposed between the light receiving element OPD and the first green light emitting element ED_G1 to extend in the second direction DR2. The second groove B2 may be connected to the first groove B1, and disposed between the light receiving element OPD and the red light emitting element ED_R to extend in the first direction DR1. The third groove B3 may be connected to the second groove B2, and disposed between the light receiving element OPD and the second green light emitting element ED_G2 to extend in the second direction DR2. The fourth groove B4 may be connected to the third groove B3, and disposed between the light receiving element OPD and the blue light emitting element ED_B to extend in the first direction DR1. The fifth groove B5 may be connected to the fourth groove B4 and the spacer opening S_OP to extend in the second direction DR2.

According to an embodiment, when the first and second green light emitting elements ED_G1, ED_G2 emit light, a path of a leakage current transferred to the light receiving element OPD through the hole control layer ECL (see FIG. 7A) may extend. Accordingly, a phenomenon that the current accumulated in the first and second green light emitting elements ED_G1, ED_G2 leaks to the light receiving element OPD through the hole control layer ECL may be reduced (or minimized). Thus, the display device DD including the sensors FX (see FIG. 3) with increased sensing performance may be provided by blocking or reducing (or minimizing) the path along which the leakage current flows to the light receiving element OPD.

According to an embodiment of the inventive concept, the common layer may be partially disconnected around the light receiving element by providing the spacer layer on the pixel definition layer adjacent to the light receiving element. Accordingly, the light receiving element is electrically connected to the light emitting elements through the common layer, and the phenomenon that the current accumulated in the light receiving element leaks through the common layer may prevented or reduced (or minimized).

The sensing performance of a sensor configured to recognize the biometric information using the light receiving element may be increased by disconnecting the common layer through the spacer layer to block the leakage of the current.

While the present inventive concept has been particularly shown and described with reference to embodiments thereof, it will be understood by those of ordinary skill in the art that various changes in form and detail may be made therein without departing from the spirit and scope of the present invention as defined by the following claims.

What is claimed is:

1. A display device, comprising:

a base layer;

a circuit layer disposed on the base layer; and an element layer disposed on the circuit layer and comprising a plurality of light emitting elements and a light receiving element disposed between the light emitting elements, wherein the element layer comprises:

a pixel definition layer comprising a plurality of light emitting openings, each overlapping a corresponding light emitting element from among the plurality of light emitting elements, and a light receiving opening overlapping the light receiving element; and a spacer layer disposed on the pixel definition layer adjacent to the light receiving opening, and comprising a spacer opening overlapping the light receiving opening, and a bridge groove connected to the spacer opening and exposing a top surface of the pixel definition layer; and a common layer commonly included in the light emitting elements and the light receiving element, wherein the common layer does not overlap the spacer layer.

2. The display device according to claim 1, further comprising:

a cathode electrode commonly included in the light emitting elements and the light receiving element, disposed on the common layer, and not overlapping the spacer layer.

3. The display device of claim 2, wherein the common layer comprises a hole control layer and an electron control layer, a portion, surrounding the spacer layer, of the common layer is connected to another portion, disposed in the spacer opening, of the common layer through the bridge groove, and a portion, surrounding the spacer layer, of the cathode electrode is connected to the another portion, disposed in the spacer opening, of the common layer through the bridge groove.

4. The display device of claim 1, wherein the spacer layer comprises a bottom surface contacting the pixel definition layer, a top surface facing the bottom surface, and side surfaces connected to the bottom surface and the top surface, wherein an angle between the bottom surface and each of the side surfaces is an obtuse angle.

5. The display device of claim 1, wherein the spacer layer comprises a first part disposed on the pixel definition layer, and a second part exposing a portion of the first part and disposed on the first part, wherein a portion exposed by the second part in the first part is more adjacent to the light emitting elements than the light receiving element.

6. The display device of claim 5, wherein the first part comprises a bottom surface contacting the pixel definition layer, a first top surface exposed from the second part, a first side surface connected to the bottom surface and the first top surface and adjacent to a plurality of light emitting areas, and a second surface adjacent to the light receiving element, the second part comprises a second top surface, a third side surface connected to the first top surface and the second surface, and a fourth side surface connected to the first top surface and the second side surface, the second side surface and the fourth side surface are aligned with each other, and each of an angle between the bottom surface and the first side surface and an angle between the bottom surface and the second side surface is an obtuse angle.

7. The display device of claim 1, wherein a width of the spacer layer is about 12 μm to about 18 μm.

8. The display device of claim 1, wherein a width between side surfaces of the spacer layer, which define the bridge groove, is about 3.5 μm to about 5 μm.

9. The display device of claim 1, wherein separation distances from an outer edge of the spacer layer to adjacent light emitting openings of the plurality of light emitting openings are the same.

10. The display device of claim 1, wherein the light emitting elements generate a first color light, a second color light, and a third color light that are different from each other, and the light emitting openings comprise:

a plurality of first light emitting openings through which the first color light is provided and which are spaced apart from each other in a first direction with the light receiving opening interposed therebetween;

a second light emitting opening through which the second color light is provided; and a third light emitting opening through which the third color light is provided and which is spaced apart from the second light emitting opening in a second direction crossing the first direction with the light receiving opening interposed therebetween, wherein an area of the second light emitting opening is greater than areas of the first light emitting openings and an area of the third light emitting opening, the second light emitting opening is spaced apart from one of the first light emitting openings in a first diagonal direction crossing the first direction and the second direction, and the third light emitting opening is spaced apart from another one of the first light emitting openings in the first diagonal direction.

11. The display device of claim 10, wherein the spacer layer is disposed between the first to third light emitting openings, and surrounds at least a portion of the light receiving opening.

12. The display device of claim 11, wherein the bridge groove is disposed between the light receiving opening and the second light emitting opening, and extends in the second direction.

13. The display device of claim 11, wherein the bridge groove comprises:

a first groove disposed between the light receiving opening and the one first light emitting opening and extending in the second direction;

a second groove connected to the first groove, disposed between the light receiving opening and the third light emitting opening, and extending in the first direction; and a third groove connected to the second groove and the spacer opening, and extending in the second direction.

14. The display device of claim 11, wherein the bridge groove comprises:

a first groove disposed between the light receiving opening and the one first light emitting opening, and extending in the second direction;

a second groove connected to the first groove, disposed between the light receiving opening and the third light emitting opening, and extending in the first direction;

a third groove connected to the second groove, disposed between the light receiving opening and the another one of the first light emitting openings, and extending in the second direction;

a fourth groove connected to the third groove, disposed between the light receiving opening and the second light emitting opening, and extending in the first direction; and a fifth groove connected to the fourth groove and the spacer opening and extending in the second direction.

15. The display device of claim 10, wherein the spacer layer further comprises:

a body disposed between the first to third light emitting openings, and surrounding at least a portion of the light receiving opening; and a plurality of protruding units, each disposed between the light emitting openings, which provide different color light, and each extending from the body in a corresponding direction between the first diagonal direction and a second diagonal direction crossing the first diagonal direction.

16. The display device of claim 15, wherein the bridge groove is disposed between the light receiving opening and the second light emitting opening, and extends in the second direction.

17. The display device of claim 15, wherein the bridge groove comprises:

a diagonal groove included in a protruding unit among the plurality of protruding units disposed between the one first light emitting opening and the second light emitting opening, and extending in the second diagonal direction;

a first groove connected to the diagonal groove, disposed between the light receiving opening and the one first light emitting opening, and extending in the second direction;

a second groove connected to the first groove, disposed between the light receiving opening and the third light emitting opening, and extending in the first direction; and a third groove connected to the second groove and the spacer opening, and extending in the second direction.

18. The display device of claim 15, wherein the bridge groove comprises:

a diagonal groove included in a protruding unit among the plurality of protruding units disposed between the one first light emitting opening and the second light emitting opening, and extending in the second diagonal direction;

a first groove connected to the diagonal groove, disposed between the light receiving opening and the one first light emitting opening, and extending in the second direction;

a second groove connected to the first groove, disposed between the light receiving opening and the third light emitting opening, and extending in the first direction;

a third groove connected to the second groove, disposed between the light receiving opening and the another one of the first light emitting openings, and extending in the second direction;

a fourth groove connected to the third groove, disposed between the light receiving opening and the second light emitting opening, and extending in the first direction; and a fifth groove connected to the fourth groove and the spacer opening, and extending in the second direction.

19. The display device of claim 1, further comprising:

an encapsulation layer disposed on the circuit layer and covering the light emitting elements and the light receiving elements; and an input sensor disposed on the encapsulation layer and comprising at least one sensing insulation layer and a conductive layer overlapping the pixel definition layer.

20. The display device of claim 19, further comprising:

a light control layer comprising a plurality of light blocking openings overlapping the light emitting openings and the light receiving opening;

a light blocking layer overlapping the pixel definition layer and disposed on the input sensor; and a plurality of color filters disposed in corresponding light blocking openings among the plurality of light blocking openings, wherein a side surface of the light blocking layer that defines the light blocking openings overlapping the light emitting openings is more adjacent to a center of the pixel definition layer than another side surface of the light blocking layer that defines the light blocking opening overlapping the light receiving opening.

* * * * *